(12) United States Patent
Shibuta

(10) Patent No.: US 9,250,537 B2
(45) Date of Patent: *Feb. 2, 2016

(54) IMMERSION EXPOSURE APPARATUS AND METHOD WITH DETECTION OF LIQUID ON MEMBERS OF THE APPARATUS

(71) Applicant: Nikon Corporation, Chiyoda-ku, Tokyo (JP)

(72) Inventor: Makoto Shibuta, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/742,743

(22) Filed: Jan. 16, 2013

(65) Prior Publication Data

US 2013/0128245 A1    May 23, 2013

Related U.S. Application Data

(62) Division of application No. 11/632,070, filed as application No. PCT/JP2005/012776 on Jul. 11, 2005, now Pat. No. 8,384,874.

(30) Foreign Application Priority Data

Jul. 12, 2004  (JP) ............................... P2004-205009

(51) Int. Cl.
    G03F 7/20       (2006.01)
(52) U.S. Cl.
    CPC ........ *G03F 7/70341* (2013.01); *G03F 7/70691* (2013.01); *G03F 7/70916* (2013.01)
(58) Field of Classification Search
    CPC .................................................. G03F 7/70916

USPC ............................................................ 355/30
See application file for complete search history.

(56) References Cited

U.S. PATENT DOCUMENTS

| 4,270,049 A | 5/1981 | Tanaka et al. |
| 4,346,164 A | 8/1982 | Tabarelli et al. |
| 4,465,368 A | 8/1984 | Matsuura et al. |
| 4,480,910 A | 11/1984 | Takanashi et al. |
| 4,672,271 A | 6/1987 | Gear et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

International Search Report dated Oct. 18, 2005, from PCT Application No. PCT/JP2005/012776.

(Continued)

*Primary Examiner* — Chia-How Michael Liu
(74) *Attorney, Agent, or Firm* — Shapiro, Gabor and Rosenberger, PLLC

(57) ABSTRACT

An exposure apparatus which prevents the damage due to the liquid having flowed out from spreading and enables satisfactory performances of the exposure processes and the measurement processes is provided. An exposure apparatus (EX) includes a movable table (PT), a base member (41) having an upper surface (41A) that guides the movement of the table (PT), and a detecting device (60) that detects whether there is a liquid on the upper surface (41A) of the base member (41).

20 Claims, 17 Drawing Sheets

(56) References Cited

U.S. PATENT DOCUMENTS

| | | |
|---|---|---|
| 5,194,893 A | 3/1993 | Nishi |
| 5,493,403 A | 2/1996 | Nishi |
| 5,528,118 A | 6/1996 | Lee |
| 5,559,582 A | 9/1996 | Nishi et al. |
| 5,610,683 A | 3/1997 | Takahashi et al. |
| 5,623,853 A | 4/1997 | Novak et al. |
| 5,646,413 A | 7/1997 | Nishi |
| 5,657,129 A | 8/1997 | Nishi |
| 5,715,039 A | 2/1998 | Fukuda et al. |
| 5,744,924 A | 4/1998 | Lee |
| 5,815,246 A | 9/1998 | Sperling et al. |
| 5,815,256 A | 9/1998 | Fukunaga |
| 5,825,043 A | 10/1998 | Suwa |
| 5,844,247 A | 12/1998 | Nishi |
| 5,874,820 A | 2/1999 | Lee |
| 5,885,134 A | 3/1999 | Shibata et al. |
| 5,942,871 A | 8/1999 | Lee |
| 5,969,441 A | 10/1999 | Loopstra et al. |
| 5,982,128 A | 11/1999 | Lee |
| 5,995,234 A | 11/1999 | Nishi |
| 6,008,500 A | 12/1999 | Lee |
| 6,020,710 A | 2/2000 | Lee |
| 6,020,964 A | 2/2000 | Loopstra et al. |
| 6,049,186 A | 4/2000 | Lee |
| 6,051,843 A | 4/2000 | Nishi |
| 6,087,797 A | 7/2000 | Lee |
| 6,150,787 A | 11/2000 | Lee |
| 6,151,105 A | 11/2000 | Lee |
| 6,175,404 B1 | 1/2001 | Lee |
| 6,188,195 B1 | 2/2001 | Lee |
| 6,208,407 B1 | 3/2001 | Loopstra et al. |
| 6,246,202 B1 | 6/2001 | Lee |
| 6,262,796 B1 | 7/2001 | Loopstra et al. |
| 6,271,640 B1 | 8/2001 | Lee |
| 6,279,881 B1 | 8/2001 | Nishi |
| 6,281,654 B1 | 8/2001 | Lee |
| 6,316,901 B2 | 11/2001 | Lee |
| 6,341,007 B1 | 1/2002 | Nishi et al. |
| 6,400,441 B1 | 6/2002 | Nishi et al. |
| 6,498,352 B1 | 12/2002 | Nishi |
| 6,549,269 B1 | 4/2003 | Nishi et al. |
| 6,566,770 B1 | 5/2003 | Nakamura |
| 6,590,634 B1 | 7/2003 | Nishi et al. |
| 6,642,994 B2 | 11/2003 | Mori et al. |
| 6,683,433 B2 | 1/2004 | Lee |
| 6,747,732 B1 | 6/2004 | Lee |
| 6,778,257 B2 | 8/2004 | Bleeker et al. |
| 6,798,491 B2 | 9/2004 | Nishi et al. |
| 6,841,965 B2 | 1/2005 | Lee |
| 6,878,916 B2 | 4/2005 | Schuster |
| 6,891,596 B2 | 5/2005 | Rostalski et al. |
| 6,891,683 B2 | 5/2005 | Schuster |
| 6,897,963 B1 | 5/2005 | Taniguchi et al. |
| 6,927,840 B2 | 8/2005 | Lee |
| 6,940,582 B1 | 9/2005 | Tanaka |
| 6,989,647 B1 | 1/2006 | Lee |
| 7,092,069 B2 | 8/2006 | Schuster |
| 7,154,676 B2 | 12/2006 | Schuster |
| 7,177,008 B2 | 2/2007 | Nishi et al. |
| 7,190,527 B2 | 3/2007 | Rostalski et al. |
| 7,203,008 B2 | 4/2007 | Schuster |
| 7,256,869 B2 | 8/2007 | Nishi |
| 7,312,847 B2 | 12/2007 | Rostalski et al. |
| 7,339,743 B2 | 3/2008 | Schuster |
| 7,365,513 B1 | 4/2008 | Lee |
| 7,379,158 B2 | 5/2008 | Mizutani et al. |
| 7,382,540 B2 | 6/2008 | Rostalski et al. |
| 7,436,487 B2 | 10/2008 | Mizutani et al. |
| 7,442,908 B2 | 10/2008 | Schuster |
| 7,460,207 B2 | 12/2008 | Mizutani et al. |
| 7,495,840 B2 | 2/2009 | Schuster |
| 7,505,115 B2 | 3/2009 | Magome et al. |
| 2001/0013580 A1 | 8/2001 | Buis et al. |
| 2001/0019250 A1 | 9/2001 | Lee |
| 2001/0030522 A1 | 10/2001 | Lee |
| 2002/0017889 A1 | 2/2002 | Lee |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2003/0022396 A1 | 1/2003 | Ogawa |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0004757 A1 | 1/2004 | Schuster |
| 2004/0032575 A1 | 2/2004 | Nishi et al. |
| 2004/0075895 A1 | 4/2004 | Lin |
| 2004/0083966 A1 | 5/2004 | Takahashi et al. |
| 2004/0095085 A1 | 5/2004 | Lee |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0120051 A1 | 6/2004 | Schuster |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0233407 A1 | 11/2004 | Nishi et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0002009 A1 | 1/2005 | Lee |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0094125 A1 | 5/2005 | Arai |
| 2005/0100745 A1 | 5/2005 | Lin et al. |
| 2005/0110973 A1 | 5/2005 | Streefkerk et al. |
| 2005/0111108 A1 | 5/2005 | Schuster |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |

(56) References Cited

U.S. PATENT DOCUMENTS

| | | |
|---|---|---|
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0178944 A1 | 8/2005 | Schuster |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0231813 A1 | 10/2005 | Rostalski et al. |
| 2005/0231814 A1 | 10/2005 | Rostalski et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk et al. |
| 2006/0023186 A1 | 2/2006 | Binnard |
| 2006/0126043 A1 | 6/2006 | Mizutani et al. |
| 2006/0126044 A1 | 6/2006 | Mizutani et al. |
| 2006/0132737 A1 | 6/2006 | Magome et al. |
| 2006/0146305 A1 | 7/2006 | Magome et al. |
| 2007/0019301 A1 | 1/2007 | Schuster |
| 2007/0109515 A1 | 5/2007 | Nishi |
| 2007/0159609 A1 | 7/2007 | Takaiwa et al. |
| 2007/0188880 A1 | 8/2007 | Schuster |
| 2007/0222967 A1 | 9/2007 | Poon et al. |
| 2007/0247722 A1 | 10/2007 | Rostalski et al. |
| 2008/0100810 A1 | 5/2008 | Shiraishi |
| 2008/0180053 A1 | 7/2008 | Lee |

FOREIGN PATENT DOCUMENTS

| | | |
|---|---|---|
| EP | 0 060 729 | 9/1982 |
| EP | 0 422 814 A2 | 10/1990 |
| EP | 0 605 103 A1 | 7/1994 |
| EP | 0 834 773 A2 | 4/1998 |
| EP | 1 018 669 A2 | 12/1999 |
| EP | 1 107 067 A2 | 6/2001 |
| EP | 1 420 298 A2 | 5/2004 |
| EP | 1 528 431 A2 | 5/2005 |
| EP | 1 571 695 A1 | 9/2005 |
| EP | 1 571 696 A1 | 9/2005 |
| EP | 1 571 699 | 9/2005 |
| EP | 1 571 699 A1 | 9/2005 |
| EP | 1 628 329 A1 | 2/2006 |
| EP | 1 653 501 A1 | 5/2006 |
| EP | 1 713 114 A1 | 10/2006 |
| JP | 57-117238 A | 7/1982 |
| JP | 57-153433 A | 9/1982 |
| JP | 58-202448 A | 11/1983 |
| JP | 59-19912 A | 2/1984 |
| JP | 62-65326 A | 3/1987 |
| JP | 63-157419 A | 6/1988 |
| JP | 01-276043 | 11/1989 |
| JP | 4-065603 A | 3/1992 |
| JP | 04-065603 A | 3/1992 |
| JP | 04-277612 A | 10/1992 |
| JP | 4-277612 A | 10/1992 |
| JP | 4-305915 A | 10/1992 |
| JP | 4-305917 A | 10/1992 |
| JP | 5-062877 A | 3/1993 |
| JP | 06-053120 A | 2/1994 |
| JP | 6-053120 A | 2/1994 |
| JP | 6-124873 A | 5/1994 |
| JP | 06-168866 A | 6/1994 |
| JP | 06-188169 A | 7/1994 |
| JP | 6-188169 A | 7/1994 |
| JP | 07-176468 A | 7/1995 |
| JP | 7-176468 A | 7/1995 |
| JP | 7-220990 A | 8/1995 |
| JP | 8-37149 A | 2/1996 |
| JP | 08-037149 A | 2/1996 |
| JP | 08-166475 | 6/1996 |
| JP | 08-316125 A | 11/1996 |
| JP | 8-316125 A | 11/1996 |
| JP | 08-330224 | 12/1996 |
| JP | 09-072943 A | 3/1997 |
| JP | 10-163099 A | 6/1998 |
| JP | 10-214783 A | 8/1998 |
| JP | 10-303114 A | 11/1998 |
| JP | 10-335235 A | 12/1998 |
| JP | 10-335236 A | 12/1998 |
| JP | 10-340846 A | 12/1998 |
| JP | 11-016816 A | 1/1999 |
| JP | 11-135400 A | 5/1999 |
| JP | 11-176727 A | 7/1999 |
| JP | 11-204390 | 7/1999 |
| JP | 11-264756 | 9/1999 |
| JP | 2000-58436 A | 2/2000 |
| JP | 2000-505958 T | 5/2000 |
| JP | 2001-203145 | 7/2001 |
| JP | 2001-345245 | 12/2001 |
| JP | 2001-345245 A | 12/2001 |
| JP | 2002-014005 | 1/2002 |
| JP | 2002-015978 | 1/2002 |
| JP | 2004-207696 | 7/2004 |
| JP | 2005-184004 A | 7/2005 |
| JP | 2005-259789 A | 9/2005 |
| JP | 2005-268700 A | 9/2005 |
| JP | 2005-268742 | 9/2005 |
| JP | 2006-024939 A | 1/2006 |
| JP | 2007-005830 | 1/2007 |
| KR | 2003-0002514 A | 1/2003 |
| WO | WO 98/28665 | 7/1998 |
| WO | WO 99/49504 A1 | 9/1999 |
| WO | WO 01/35168 A1 | 5/2001 |
| WO | WO 01/67505 A2 | 9/2001 |
| WO | WO 02/091078 | 11/2002 |
| WO | WO 03/077036 | 9/2003 |
| WO | WO 03/077037 | 9/2003 |
| WO | WO 2004/019128 A2 | 3/2004 |
| WO | WO 2004/053953 A1 | 6/2004 |
| WO | WO 2004/053958 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 | 9/2004 |
| WO | WO 2004/081666 | 9/2004 |
| WO | WO 2004/090577 A2 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/105107 A1 | 12/2004 |
| WO | WO 2005/001432 | 1/2005 |
| WO | WO 2005/001572 | 1/2005 |
| WO | WO 2005/003864 | 1/2005 |
| WO | WO 2005/006026 | 1/2005 |
| WO | WO 2005/008339 | 1/2005 |
| WO | WO 2005/010962 A1 | 2/2005 |
| WO | WO 2005/013008 | 2/2005 |
| WO | WO 2005/015283 | 2/2005 |

(56) References Cited

FOREIGN PATENT DOCUMENTS

| | | |
|---|---|---|
| WO | WO 2005/017625 | 2/2005 |
| WO | WO 2005/019935 | 3/2005 |
| WO | WO 2005/022266 | 3/2005 |
| WO | WO 2005/024325 | 3/2005 |
| WO | WO 2005/024517 | 3/2005 |
| WO | WO 2005/034174 | 4/2005 |
| WO | WO 2005/050324 | 6/2005 |
| WO | WO 2005/054953 | 6/2005 |
| WO | WO 2005/054955 | 6/2005 |
| WO | WO 2005/059617 | 6/2005 |
| WO | WO 2005/059618 | 6/2005 |
| WO | WO 2005/059645 | 6/2005 |
| WO | WO 2005/059654 | 6/2005 |
| WO | WO 2005/062128 | 7/2005 |
| WO | WO 2005/064400 | 7/2005 |
| WO | WO 2005/064405 | 7/2005 |
| WO | WO 2005/069055 | 7/2005 |
| WO | WO 2005/069078 | 7/2005 |
| WO | WO 2005/069081 | 7/2005 |
| WO | WO 2005/071491 | 8/2005 |
| WO | WO 2005/074606 | 8/2005 |
| WO | WO 2005/076084 | 8/2005 |
| WO | WO 2005/076321 A1 | 8/2005 |
| WO | WO 2005/081030 | 9/2005 |
| WO | WO 2005/081067 | 9/2005 |
| WO | WO 2005/098504 | 10/2005 |
| WO | WO 2005/098505 | 10/2005 |
| WO | WO 2005/098506 | 10/2005 |
| WO | WO 2005/106589 | 11/2005 |
| WO | WO 2005/111689 | 11/2005 |
| WO | WO 2005/111722 | 11/2005 |
| WO | WO 2005/119368 | 12/2005 |
| WO | WO 2005/119369 | 12/2005 |

OTHER PUBLICATIONS

Notice of Allowance issued Mar. 6, 2009, in European Patent Application No. 05758280.1.
Notice of Opposition issued Jun. 18, 2010, in European Patent Application No. 05758280.1.
Non-final Office Action dated Jun. 27, 2008, in U.S. Appl. No. 11/632,070.
Non-final Office Action dated Nov. 26, 2008, in U.S. Appl. No. 11/632,070.
Final Office Action dated Aug. 12, 2009, in U.S. Appl. No. 11/632,070.
Non-final Office Action dated Jan. 22, 2010, in U.S. Appl. No. 11/632,070.
Final Office Action dated Aug. 11, 2010, in U.S. Appl. No. 11/632,070.
Non-final Office Action dated Apr. 13, 2011, in U.S. Appl. No. 11/632,070.
Final Office Action dated Oct. 28, 2011, in U.S. Appl. No. 11/632,070.
"HPQ-D Series Optical Liquid Leak Detectors with Self-Contained Amplifier", Yamatake Sensing Control, Ltd, Oct. 2003, pp. 1-12.
Streefkerk et al., "Extending optical lithography with immersion", Optical Microlithography XVII, Proceedings of SPIE, vol. 5377, Feb. 2004, pp. 285-305.
Extended European Search Report dated Jan. 30, 2008 from counterpart European Appln. No. 05758280.1.
European Office Action dated Jul. 11, 2008 from counterpart European Appln. No. 05758280.1.
Office Action dated Mar. 18, 2008 from counterpart Singapore Appln. No. 200700191-0.
Notice of Allowance dated Oct. 14, 2008 from counterpart Singapore Appln. No. 200700191-0.
Written Opinion of the International Searching Authority dated Oct. 18, 2005 from underlying PCT Appln. No. PCT/JP2005/012776.
B.J. Lin, "Semiconductor Foundry, Lithography, and Partners", Emerging Lithographic Technologies VI, Proceedings of SPIE, vol. 4688, 2002, pp. 11-24.
Switkes et al, "Resolutions Enhancements of 157 nm Lithography by Liquid Immersion", Optical Microlithography XV, Proceedings of SPIE, vol. 4691, 2002, pp. 459-465.
Switkes et al., Resolution Enhancement of 157nm Lithography by Liquid Immersion, J. Microlith, Microfab, Microsyst, Society of Photo-Optical Instrumentation Engineers, vol. 1, No. 3, Oct. 2002.
Owa et al., "Nikon F2 Exposure Tool", Nikon Corporation 3rd 157nm Symposium, Sep. 4, 2002, Slides 1-25.
Nikon Corporation, Immersion Lithography Workshop, Dec. 11, 2002, Slides 1-24.
Owa et al., "Immersion Lithography Its Potential Performance and Issues", Optical Microlithography XVI, Proceedings of SPIE, vol. 5040, 2003, pp. 724-733.
Owa et al, "Update on 193nm Immersion Exposure Tool", Nikon Corporation Immersion Workshop, Jan. 27 2004, Slides 1-38.
Owa et al., "Update on 193nm Immersion Exposure Tool", Nikon Corporation, Litho Forum, Jan. 28, 2004, Slides 1-51.
Owa et al., "Potential Performances and Feasibility of Immersion Lithography", Nikon Corporation, NGL Workshop, Jul. 10, 2003, Slides 1-33.
Mar. 20, 2007 Office Action in child U.S. Appl. No. 11/366,743.
Dec. 17, 2007 Office Action in child U.S. Appl. No. 11/366,743.
May 22, 2008 Office Action in child U.S. Appl. No. 11/366,743.
Apr. 17, 2008 Supplemental European Search Report in corresponding Application No. EP04748150.
Dec. 7, 2007 Office Action issued in Chinese Patent Application No. 200480021856.1.
Dec. 15, 2009 Japanese Office Action in Application No. 2004-218934.
Mar. 16, 2010 Japanese Notice of Allowance in Application No. 2004-218934.
Dec. 15, 2009 Japanese Office Action in Application No. 2006-274331.
Mar. 16, 2010 Japanese Notice of Allowance in Application No. 2006-274331.
Nov. 2, 2004 International Search Report and Written Opinion in Application No. PCT/JP2004/010991.
Oct. 30, 2008 Notice of Allowance in U.S. Appl. No. 11/366,743.
Aug. 19, 2008 Communication Pursuant to Article 91(3) in European Application No. 04748150.2.
Sep. 5, 2008 Chinese Notice of Allowance in Application No. 200480021856.1.
Mar. 16, 2010 Chinese Office Action in Application No. 200810173387.5.
Jun. 2, 2010 Office Action in Chinese Application No. 200810173386.0.
Jun. 2, 2010 Office Action in Chinese Application No. 200810173388.X.
Dec. 28, 2010 Office Action issued for Taiwanese Application No. 093122481.
Feb. 28, 2011 Office Action in Korean Application No. 10-2006-7001706.
Mar. 17, 2011 Communication Pursuant to Article 94(3) in European Application No. 04748150.2.
Mar. 21, 2011 European Search Report in European Application No. 10184278.9.
Mar. 21, 2011 European Search Report in European Application No. 10184336.5.
Mar. 11, 2011 Office Action issued in Chinese Application No. 200810173396.4.
Mar. 14, 2011 Office Action issued in Chinese Application No. 200810173395.X.
Mar. 21, 2011 Search Report issued in European Application No. 10184326.6.
May 13, 2011 Office Action issued in Chinese Application No. 200810173387.5.
Jul. 26, 2011 Office Action issued in Japanese Application No. 2006-529038.
Summons to Attend Oral Proceedings issued in counterpart European Patent Appln. No. 05758280.1 dated Feb. 8, 2012.
Decision of Aug. 28, 2012, revoking European Patent No. EP-B-1 780 772.
Notice of Opposition in European Patent Application No. 05758280.1, May 15, 2013.
Office Action (Reply from the Opponent to Submission of Proprietor) dated Feb. 11, 2014 in European Patent Application No. 05758280.1.

IMMERSION EXPOSURE APPARATUS AND METHOD WITH DETECTION OF LIQUID ON MEMBERS OF THE APPARATUS

TECHNICAL FIELD

The present invention relates to an exposure apparatus that exposes a substrate via a liquid and to a device manufacturing method.

The present application claims priority to Japanese Patent Application No. 2004-205009, filed on Jul. 12, 2004, and its content is incorporated herein by reference.

BACKGROUND ART

Semiconductor devices and liquid crystal display devices are manufactured through the so-called photolithography technique, by which a pattern formed on a mask is transferred onto a photosensitive substrate. The exposure apparatus used in the photolithography process has a mask stage that supports a mask and a substrate stage that supports a substrate, and while successively moving the mask stage and the substrate stage, transfers the mask pattern, via a projection optical system, onto the substrate. In recent years, to address the increasingly high integration of device patterns, increasingly high resolution of the projection optical system has been desired. The shorter the exposure wavelength used is, and, also, the larger the numerical aperture of the projection optical system is, the higher the resolution of the projection optical system becomes. For this reason, the exposure wavelength used for the exposure apparatus is becoming shorter and shorter year by year, and the numerical aperture of the projection optical system is also becoming larger and larger. In this context, the presently dominant exposure wavelength is 248 nm from a KrF excimer laser, but a still shorter wavelength of 193 nm from an ArF excimer laser is now gradually being put to practical use.

In addition, when performing exposure, the depth of focus (DOF) is an important factor along with the resolution. The resolution R and the depth of focus δ are respectively expressed by the following formulas:

$$R = k_1 \cdot \lambda/NA, \quad (1)$$

$$\delta = \pm k_2 \cdot \lambda/NA^2, \quad (2)$$

where λ is the exposure wavelength, NA is the numerical aperture of the projection optical system, and $k_1$ and $k_2$ are process coefficients. It can be seen from formulas (1) and (2) that if, to enhance the resolution R, the wavelength λ is made shorter and the numerical aperture is made larger, then the depth of focus δ becomes narrower.

When the depth of focus δ becomes too narrow, it becomes difficult to make the substrate surface coincide with the image plane of the projection optical system, and thus there occurs the possibility that the focus margin during the exposure operation will be insufficient. To address this problem, the liquid immersion method, which is disclosed in, e.g., Patent Document 1 mentioned below, has been proposed as a method to make the exposure wavelength shorter in effect and to make the depth of focus broader. This liquid immersion method is designed to, by filling the space between the under surface of the projection optical system and the substrate surface with a liquid, e.g., water or organic solvent to form a liquid immersion region and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

Patent Document 1: International Publication WO 99/49504

DISCLOSURE OF INVENTION

Problem to be Solved by the Invention

By the way, when the liquid of the liquid immersion region or the liquid for exposure flows out, and the condition is left as it is, the ambience (humidity etc.) in which the exposure apparatus is placed changes, and thus there occur disadvantages, e.g., a disadvantage that the measurement accuracies deteriorate with the ambience change of the optical paths of the interferometers for measuring the position of the stages occurring. Also, there is the possibility that there occur disadvantages due to the liquid having flowed out, e.g., a disadvantage that the surrounding devices etc. break down, are subject to an electric leakage, or rust, and thus the exposure accuracy and the measurement accuracies may deteriorate. Further, when the liquid having flowed out expands, it may for example adversely affect, e.g., various devices constituting the exposure apparatus, spreading the damage.

The present invention has been made in consideration of such situations, and its objective is to provide an exposure apparatus which prevents the damage due to the liquid having flowed out from spreading and by which the exposure processes and the measurement processes can be performed satisfactorily and to provide a device manufacturing method.

Means for Solving Problem

To resolve the above-described problems, the present invention adopts the following configurations corresponding to FIGS. 1 to 24 as illustrated in embodiments. It is to be noted that the parenthesized letter or numeral attached to each constituent element merely exemplifies such element, with which it is not intended to limit the respective elements.

The exposure apparatus (EX) of the present invention, that exposes a substrate (P) via a liquid (LQ), comprising a movable table (PT, PT1, PT2), a base member (41) having an upper surface (41A) that guides the movement of the table (PT, PT1, PT2), and a detecting device (60) that detects whether there is a liquid (LQ) on the upper surface (41A) of the base member (41).

According to the present invention, there is provided the detecting device that detects whether there is a liquid on the upper surface of the base member that guides the movement of the table, and thus when the detecting device detects a liquid, an appropriate step or measurement, e.g., a step to remove the liquid can be promptly taken. Thus, the damage due to the liquid having flowed out is prevented from spreading, and the exposure processes and the measurement processes can be performed satisfactorily.

Further, the exposure apparatus (EX) of the present invention, that exposes a substrate (P) via a liquid (LQ), comprising a detecting device (60) that is capable of detecting a liquid (LQ) and a movable member (44, 50, PT, etc.) that while supporting the detecting device (60), is movable.

According to the present invention, the detecting device that is capable of detecting a liquid is supported and moved by the movable member, thus, it is possible to detected whether there is a liquid with respect to an area of a relatively large, detectable area. Therefore, the damage due to the liquid having flowed out is prevented from spreading, and the exposure processes and the measurement processes can be performed satisfactorily.

The device manufacturing method of the present invention utilizes the above-described exposure apparatus (EX).

Since, according to the present invention, the exposure processes and the measurement processes can be performed satisfactorily, devices having a desired performance can be manufactured.

Effect of the Invention

Since, according to the present invention, the damage due to the liquid having flowed out is prevented from spreading, the exposure processes and the measurement processes can be performed satisfactorily.

DESCRIPTION OF THE REFERENCE SYMBOLS

1 . . . liquid immersion mechanism; 2 . . . optical element; 10 . . . liquid supply mechanism; 20 . . . liquid recovery mechanism; 26 . . . liquid recovery port; 29 . . . second liquid recovery mechanism; 41 . . . base member; 41A . . . upper surface; 41B . . . side surface; 42 . . . air bearing; 42A . . . air suction port; 42B . . . blowout port; 42E . . . peripheral region; 42S . . . bearing surface; 42T . . . center region; 46 . . . laser interferometer; 50 . . . guided member; 50A . . . first guiding member; 50B . . . second guiding member; 60 . . . detecting device; 61 . . . floodlighting portion; 62 . . . light receiving portion; 65A-65E . . . detecting device; 70 . . . nozzle member; CONT controller; EX . . . exposure apparatus; FD floor face; La . . . detecting light; LQ . . . liquid; P substrate; PST . . . substrate stage; PSTD . . . substrate stage driving mechanism; PT . . . substrate table; PT1 . . . measurement table PT2 . . . measurement table; PTA . . . substrate table undersurface; PTE . . . substrate table edge portion.

BEST MODE FOR CARRYING OUT THE INVENTION

Figure 1:
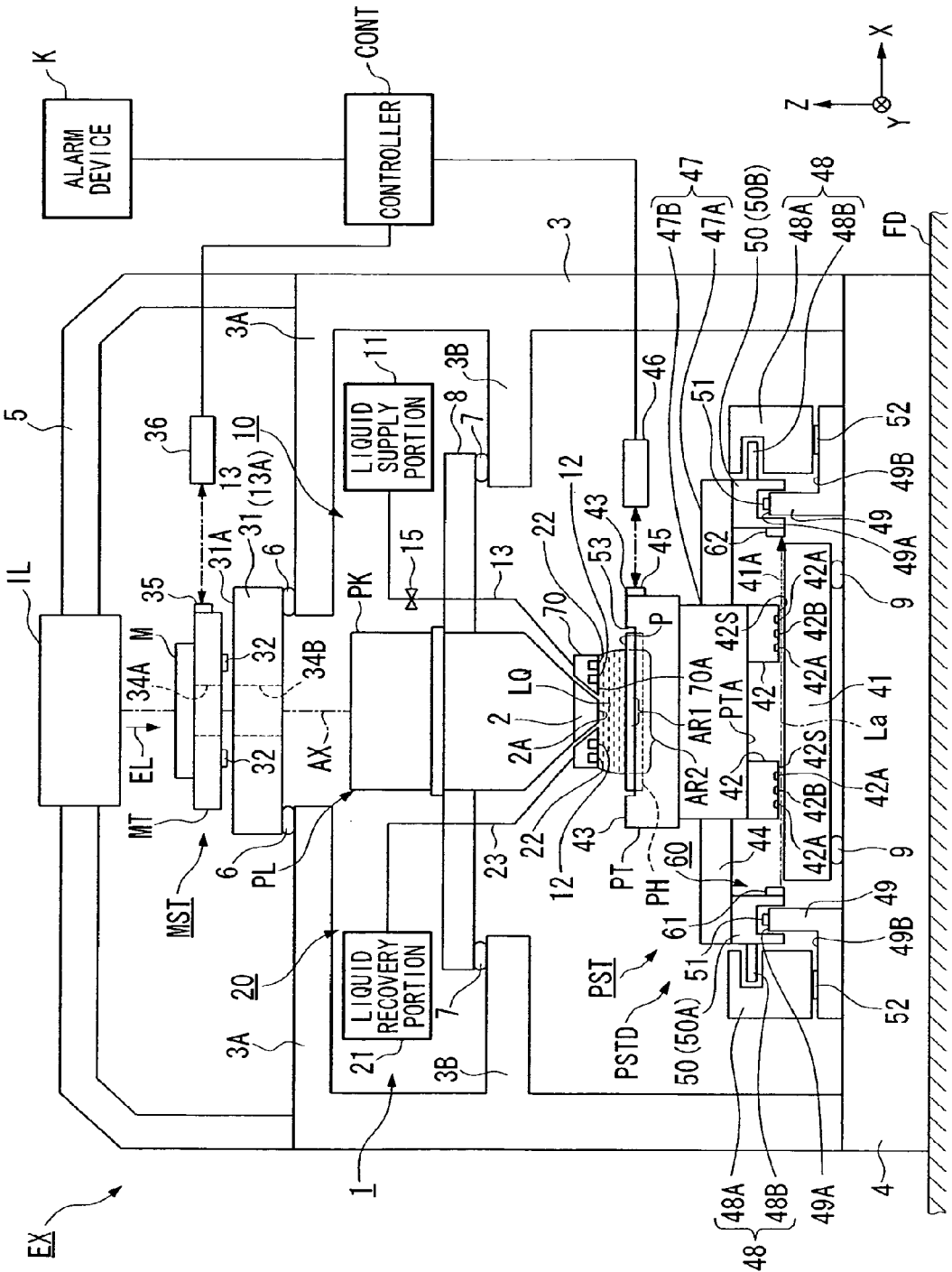
FIG. 1 is a schematic diagram showing an embodiment of an exposure apparatus of the present invention.

In the following, embodiments of the present invention will be described referring to the drawings. FIG. 1 is a schematic diagram showing an embodiment of an exposure apparatus of the present invention.

In FIG. 1, exposure apparatus EX comprises mask table MT that is movable while holding mask M, with substrate table PT that is movable while holding substrate P, with illumination optical system IL that illuminates mask M supported by mask table MT with exposure light EL, with projection optical system PL that projects a pattern image of mask M illuminated with exposure light EL onto substrate P supported by substrate table PT, and with controller CONT that controls the overall operation of exposure apparatus EX. To controller CONT is connected alarm device K that raises an alarm when a problem occurs with respect to the exposure process.

Further, exposure apparatus EX comprises main column 3 that supports projection optical system PL etc. Main column 3 is set on surface plate 4 which is placed horizontally on floor face FD. Main column 3 comprises upper side stage portion 3A and lower side stage portion 3B that protrude toward the inside thereof.

Exposure apparatus EX of this embodiment is a liquid immersion exposure apparatus to which a liquid immersion method is applied, with the exposure wavelength being shortened in effect, to improve the resolution and, at the same time, to widen the depth of focus. Exposure apparatus EX comprises liquid immersion mechanism 1 that is capable of forming liquid immersion region AR2 of liquid LQ on substrate P. Liquid immersion mechanism 1 comprises liquid supply mechanism 10 that supplies liquid LQ onto substrate P and with liquid recovery mechanism 20 that recovers liquid LQ on substrate P. Exposure apparatus EX adopts a local liquid immersion system in which, at least while transferring the pattern image of mask M onto substrate P, liquid immersion region AR2 is locally formed by liquid LQ having been supplied from liquid supply mechanism 10 on a substrate P's portion that includes projection area AR1 of projection optical system PL. Liquid immersion region AR2 that is larger than projection area AR1 and is smaller than substrate P. More specifically, exposure apparatus EX, by filling with liquid LQ the space between optical element 2 located on the projection optical system PL's image plane side end and the surface of substrate P, forms liquid immersion region AR2 and, by projecting the pattern image of mask M onto substrate P via this liquid LQ between projection optical system PL and substrate P, exposes substrate P.

Further, in the vicinity of the image plane of projection optical system PL, specifically, in the vicinity of optical element 2, which is located on the projection optical system PL's image plane side end, nozzle member 70 which constitutes a portion of liquid immersion mechanism 1 is disposed. Nozzle member 70 is a ring-shaped member that is disposed so as to surround, over or above substrate P (substrate table PT), the end portion of projection optical system PL.

Further, as will be later described in detail, exposure apparatus EX comprises base member 41 having upper surface 41A that guides the movement of substrate table PT and comprises detecting device 60 that detects whether there is liquid LQ on upper surface 41A of base member 41.

The embodiment will be described by assuming, as an example, a case where as exposure apparatus EX, a scan type exposure apparatus (the so-called scanning stepper) in which while synchronously moving mask M and substrate P in the directions, along the scanning direction different from each other (opposite directions), the pattern formed on mask M is exposed onto substrate P is used. In the following description, it is assumed that the direction that coincides with optical axis AX of projection optical system PL is referred to as the Z-axis direction, that the synchronous movement direction (scanning direction), in a plane perpendicular to the Z-axis direction, of mask M and substrate P is referred to as the X-axis direction, and that the direction perpendicular to the Z-axis direction and to the X-axis direction (non-scanning direction) is referred to as the Y-axis direction. Further, it is assumed that the direction around the X-axis, the direction around the Y-axis, and the direction around the Z-axis are respectively referred to as the θX-direction, the θY-direction, and the θZ-direction. It should be noted that a "substrate" referred to herein includes a semiconductor wafer over which photoresist which is a photosensitive material is applied, and a "mask" includes a reticle on which a device pattern to be reduction-projected onto the substrate is formed.

Illumination optical system IL is supported by supporting column 5 that is fixed on the upper portion of main column 3. Illumination optical system IL is for illuminating mask M supported by mask table MT with exposure light EL and comprises an exposure light source, an optical integrator for uniformizing the illuminance of the light flux emitted from the exposure light source, a condenser lens for condensing exposure light EL from the optical integrator, a relay lens system, a field stop for setting an illumination area formed by exposure light EL on mask M, etc. A specified illumination area on mask M is illuminated, by illumination optical system IL, with exposure light EL having a uniform illuminance distribution. As exposure light EL emitted from illumination optical system IL, for example, a bright line (g-line, h-line, i-line) emitted from a mercury lamp, a deep ultraviolet light (DUV light) such as a KrF excimer laser light (wavelength of 248 nm), or a vacuum ultraviolet light (VUV light) such as an ArF excimer laser light (wavelength of 193 nm) or an $F_2$ excimer laser light (wavelength of 157 nm) may be used. In the embodiment, an ArF excimer laser light is used.

In the embodiment, purified water is used as liquid LQ. Purified water can transmit not only an ArF excimer laser light but also, for example, a bright line (g-line, h-line, or i-line) emitted from a mercury lamp and a deep ultraviolet light (DUV light) such as a KrF excimer laser light (wavelength of 248 nm).

Mask table MT is configured to be movable, while holding mask M. At upper side stage portion 3A of main column 3 is supported base member 31 via vibration isolation unit 6. On the undersurface of mask table MT are provided a plurality of gas bearings (air bearings) 32, which are non-contact type bearings. Mask table MT is supported by air bearings 32 in a non-contact manner relative to upper surface (guide surface) 31A of base member 31 and, by a mask table driving mechanism including a linear motor etc., mask table MT is two-dimensionally movable in a plane perpendicular to optical axis AX of projection optical system PL, i.e., in the XY-plane, and is finely rotatable in the θZ-direction. At least a portion of mask stage MST, which moves while supporting mask M, is constituted by the above-described mask table MT, mask table driving mechanism, etc.

Mask table MT is provided with moving mirror 35. Further, laser interferometer 36 is provided at a position facing moving mirror 35. The two-dimensional position and the rotation angle in the θZ-direction (including the rotation angles in the θX- and θY-directions in some cases) of mask table MT supporting mask M are measured by laser interferometer 36 in real time, and the measurement results are outputted to controller CONT. By driving the mask table driving mechanism based on the measurement results from laser interferometer 36, controller CONT controls the position of mask M supported by mask table MT.

Projection optical system PL is for projecting the pattern of mask M onto substrate P at a predetermined projection magnification of β. Projection optical system PL is constituted by a plurality of optical elements including optical element (lens) 2 disposed in the projection optical system's end portion on the side of substrate P, and these optical elements are supported by lens barrel PK. Optical element 2, which is located in the projection optical system PL's end portion, protrudes from lens barrel PK. Optical element 2 is configured so as to come into contact liquid LQ of liquid immersion region AR2. Further, optical element 2's liquid contact surface (undersurface) 2A that comes into contact liquid LQ of liquid immersion region AR2 is liquid-attractive or lyophilic to liquid LQ.

In the embodiment, projection optical system PL is a reduction system of which projection magnification β is, e.g., ¼, ⅕, or ⅛. It should be noted that projection optical system PL may also be either a unit magnification system or a magnifying system. Further, projection optical system PL may be either one of a refractive system which does not include any reflective optical member, a reflection system which does not include any refractive optical element, or a catadioptric system which includes a reflective optical member and a refractive optical element. Lens barrel surface plate 8 supporting projection optical system PL's lens barrel PK is supported by lower side stage portion 3B of main column 3 via vibration isolation unit 7.

Substrate table PT is configured to be movable, while holding substrate P via substrate holder PH. Concave portion 53 is provided on substrate table PT, and substrate holder PH is disposed in concave portion 53. Further, substrate table PT's top face 43 is a flat surface, and top face 43 and the surface of substrate P held by substrate holder PH are substantially flush with each other.

On the undersurface of substrate table PT are provided a plurality of gas bearings (air bearings) 42, which are non-contact type bearings. Base member 41 is supported on surface plate 4 via vibration isolation unit 9. A air bearings 42 have bearing surfaces 42S that face upper surface (guide surface) 41A of base member 41. Air bearings 42 comprise blowout ports 42B that are provided in bearing surfaces 42S and blow a gas (air) against base member 41's upper surface 41A and air suction ports 42A that are provided in bearing surfaces 42S and suck the gas between bearing surfaces 42S and guide surface 41A. Air bearings 42 keep a constant gap between substrate table PT's undersurface PTA (bearing surfaces 42S) and guide surface 41A through a balance between the repulsive force caused by the gas blowing from blowout ports 42B and the sucking force by air suction ports 42A. Air bearings 42 support substrate table PT relative to upper surface 41A of base member 41 in a non-contact manner. Substrate table PT is guided, in the state of being supported by air bearings 42 in a non-contact manner relative to base member 41's upper surface 41A, over base member 41's upper surface 41A by substrate stage driving mechanism PSTD including the below-described linear motors 47 and 48, X-guide stage 44, and guided members 50, while substrate table PT is two-dimensionally movable in a plane perpendicular to optical axis AX of projection optical system PL, i.e., in the XY-plane, and is finely rotatable in the θZ-direction. Further, substrate holder PH on substrate table PT is provided such that it can be moved in the Z-axis-, θX-, and θY-directions by a holder driving mechanism, not shown. Substrate stage PST that moves while supporting substrate P is constituted by substrate table PT, substrate stage driving mechanism PSTD, etc. The holder driving mechanism and substrate stage driving mechanism PSTD are controlled by controller CONT.

Further, exposure apparatus EX comprises a focus-leveling detection system, not shown, that detects the position of the surface of substrate P supported by substrate table PT. The focus-leveling detection system detects the position information, in the Z-axis-direction, of the substrate P's surface and the inclination information, in the θX- and θY-directions, of substrate P. It is to be noted that as the configuration of the focus-leveling detection system, such a configuration as disclosed in, e.g., Japanese Unexamined Patent Publication Hei 8-37149 may be used. The detection results from the focus-leveling detection system are outputted to controller CONT. By driving the holder driving mechanism based on the detection results from the focus-leveling detection system, controller CONT controls the focus position (Z-position) and inclination angles of the surface of substrate P to adjust the surface of substrate P to the image plane of projection optical system PL.

Substrate table PT comprises moving mirror 45. Further, laser interferometer 46 is positioned at a position facing moving mirror 45. The two-dimensional position and rotation angle of substrate table PT supporting substrate P are measured by laser interferometer 46 in real time, and the measurement results are outputted to controller CONT. By driving substrate stage driving mechanism PSTD based on the measurement results from laser interferometer 46, controller CONT performs the positioning, in the X-axis-direction and Y-axis direction, of substrate P supported by substrate table PT.

Substrate table PT is supported by X-guide stage 44 so as to movable in the X-axis-direction. Being guided by X-guide stage 44, substrate table PT can be moved by X-linear motor 47 in the X-axis direction within a predetermined stroke. X-linear motor 47 comprises stator 47A that is provided to X-guide stage 44 so as to extend in the X-axis-direction and mover 47B that is provided so as to correspond stator 47A and is fixed on substrate table PT. Thus, with mover 47B being driven relative to stator 47A, substrate table PT moves in the X-axis-direction in a state of being supported in a non-contact manner by X-guide stage 44.

On both ends in the longitudinal direction of X-guide stage 44 are provided a pair of Y-linear motors 48 that are capable of moving X-guide stage 44, along with substrate table PT, in the X-axis-direction. Each of Y-linear motors 48 comprises mover 48B that is provided on each of both ends in the longitudinal direction of X-guide stage 44 and stator 48A that is provided so as to correspond to mover 48B. Thus, with movers 48B being driven relative to stators 48A, X-guide stage 44 moves along with substrate table PT in the Y-axis-direction. Further, it is configured such that with each of the drives of Y-linear motors 48 being adjusted, X-guide stage 44 and substrate table PT are be rotationally movable also in the θX-direction.

A guide portion 49 is provided on each of the X-axis-direction sides of base member 41. Guide portion 49 is formed in an L shape and guides the Y-axis-direction movement of X-guide stage 44. Guide portions 49 are supported by surface plate 4. In the embodiment, stator 48A of Y-linear motor 48 is provided on flat portion 49B of guide portion 49. On the other hand, a concavity-shaped guided member 50 (50A, 50B) is provided on each of both end portions of the undersurface of X-guide stage 44 in the longitudinal direction thereof. Guide portion 49 is joined to guided member 50, and upper surface (guide surface) 49A of guide portion 49 is provided so as to face the inner surface of guided member 50. Gas bearing (air bearing) 51, which is a non-contact bearing, is provided on guide surface 49A of guide portion 49. X-guide stage 44 is supported in a non-contact manner relative to guide surface 49A. Guided member 50 moves along with the movement of X-guide stage 44.

Further, between stator 48A of Y-linear motor 48 and flat portion 49B of guide portion 49 exists gas bearing (air bearing) 52, which is a non-contact bearing, and stator 48A is supported by air bearing 52 in a non-contact manner relative to flat portion 49B of guide portion 49. For this reason, because of the law of conservation of momentum, stator 48A moves in the −Y-direction (+Y-direction) in response to the movement in the +Y-direction (−Y-direction) of X-guide stage 44 and substrate table PT. Through the movement of stator 48A, the reaction force accompanying the movement of X-guide stage 44 and substrate table PT is cancelled, and, at the same time, the change of the gravity center can be prevented. In other words, stator 48A has a function as a so-called counter mass.

Liquid supply mechanism 10 is for supplying liquid LQ to a space on the image plane side of projection optical system PL. Liquid supply mechanism 10 comprises liquid supply portion 11 capable of delivering liquid LQ and supply pipe 13 of which one end portion is connected to liquid supply portion 11. The other end portion of supply pipe 13 is connected to nozzle member 70. Liquid supply portion 11 comprises a tank that stores liquid LQ, a pressurized pump, etc. It is to be noted that exposure apparatus EX need not be provided with all of the tank, the pressurized pump, etc., and at least a part of them may be substituted by the facilities of, e.g., a factory in which exposure apparatus EX is installed.

In the midstream of supply pipe 13 is provided valve 15 that opens and closes the flow path of supply pipe 13. The open/close operations of valve 15 are controlled by controller CONT. It should be noted that valve 15 of the embodiment is a so-called normally closed one that mechanically closes the flow path of supply pipe 13 when the driving source (power supply) for exposure apparatus EX stops due to, e.g., a power outage.

Liquid recovery mechanism 20 is for recovering liquid LQ from the space on the image plane side of projection optical system PL. Liquid recovery mechanism 20 comprises liquid recovery portion 21 capable of recovering liquid LQ and recovery pipe 23 of which one end is connected to liquid recovery portion 21. The other end of recovery pipe 23 is connected to nozzle member 70. Liquid recovery portion 21 comprises a vacuum system (suction device), e.g., a vacuum pump, a gas-liquid separator that separates the recovered liquid LQ from gas, a tank that stores the recovered liquid LQ, etc. It should be noted that exposure apparatus EX need not be provided with all of the vacuum system, the gas-liquid separator, the tank, etc., and at least a part of them may be substituted by the facilities of, e.g., a factory in which exposure apparatus EX is installed.

Nozzle member 70 is provided in the vicinity of optical element 2, which comes into contact with liquid LQ, among a plurality of optical elements constituting projection optical system PL. Nozzle member 70 is a ring-shaped member that is provided so as to surround, over or above substrate P (substrate table PT), the side surface of optical element 2. A clearance is provided between nozzle member 70 and optical element 2, and nozzle member 70 is supported by a certain supporting mechanism so as to be vibrationally isolated from optical element 2. Undersurface 70A of nozzle member 70 is arranged above substrate P (substrate table PT) and faces the surface of substrate P (top face 43 of substrate table PT). Further, each of undersurface 70A of nozzle member 70 and undersurface 2A of optical element 2 is a substantially flat surface, and undersurface 70A of nozzle member 70 and undersurface 2A of optical element 2 are substantially flush with each other. By this, liquid immersion region AR2 can be formed satisfactorily within a desired region.

Supply port 12 for supplying liquid LQ onto substrate P is provided in undersurface 70A of nozzle member 70. A plurality of supply ports 12 are provided in undersurface 70A of nozzle member 70. Further, an inner flow path that connects the other end portion of supply pipe 13 to supply ports 12 is formed inside nozzle member 70 is formed.

Further, recovery port 22 for recovering liquid LQ on substrate is provided in undersurface 70A of nozzle member 70. In the embodiment, recovery port 22 is provided, in undersurface 70A of nozzle member 70, at a position outside of supply ports 12 relative to optical axis AX of projection optical system PL so as to surround supply ports 12. Further, an inner flow path that connects the other end portion of recovery pipe 23 to recovery port 22 is formed inside nozzle member 70.

The operations of liquid supply portion 11 and liquid recovery portion 21 are controlled by controller CONT. In forming liquid immersion region AR2 of liquid LQ onto substrate P, controller CONT delivers liquid LQ from liquid supply portion 11 and supplies liquid LQ onto substrate P from supply ports 12 provided above substrate P via supply pipe 13 and the inner flow path of nozzle member 70. Further, liquid LQ on substrate P is recovered by recovery port 22 and is recovered by and into liquid recovery portion 21 via the inner flow path of nozzle member 70 and recovery pipe 23. It is to be noted that the configuration of liquid immersion mechanism 1 is not limited to the above-described one, and such a configuration as described in, e.g., European Patent Application Publication No. 1420298, International Publication WO 2004/055803, International Publication WO 2004/057589, or International Publication WO 2004/057590 may be used.

Figure 2:
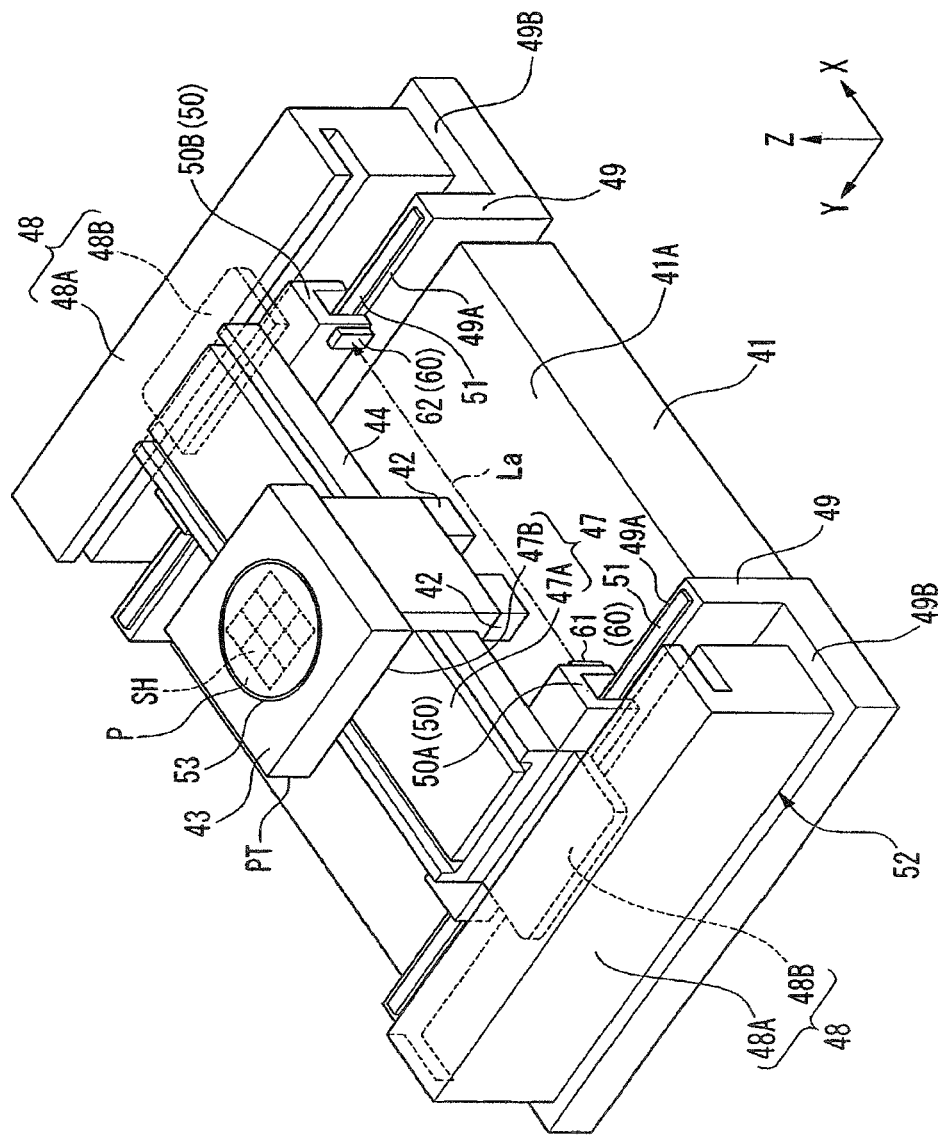
FIG. 2 is a schematic diagram showing a substrate table.
Figure 3:
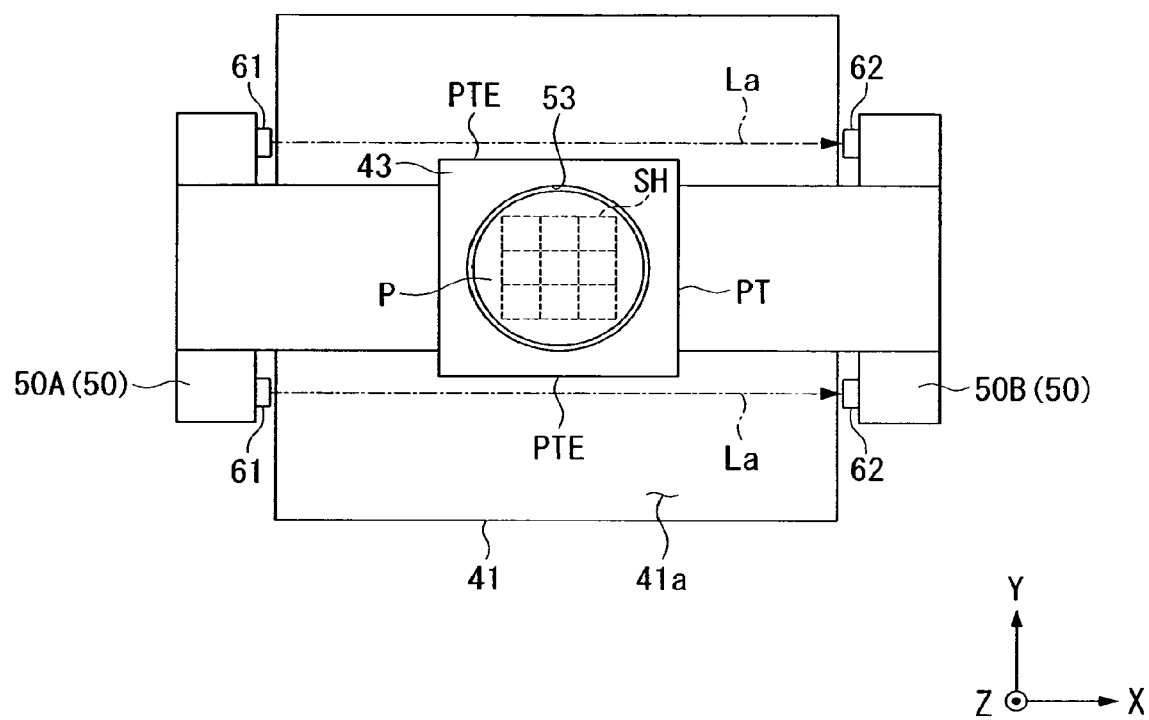
FIG. 3 is a plan view of the substrate table as viewed from above.

Next, referring to FIGS. 2 and 3, detecting device 60 will be described. FIG. 2 is a perspective view showing substrate stage PST; FIG. 3 is a plan view of substrate stage PST.

Detecting device 60 is for detecting whether there is liquid LQ on upper surface 41A of base member 41, which guides the movement of substrate table PT. Detecting device 60 comprises light projecting portion 61 that emits detecting light La and light receiving portion 62 that is disposed in a predetermined position relative to detecting light La. In the embodiment, light projecting portion 61 is attached to, among the two first guided member 50A and guided member 50B that face each other, first guided member 50A that is disposed on the −X side relative to base member 41, and light receiving portion 62 is attached to guided member 50B that is disposed on the +X side. Light projecting portion 61 and light receiving portion 62, which are respectively attached to first guided member 50A and guided member 50B, are provided such that they face each other, with base member 41 being positioned therebetween.

As described above, guided members 50 are attached to X-guide stage 44, which constitutes a portion of substrate stage driving mechanism PSTD for driving substrate table PT. The detecting device 60 (light projecting portion 61 and light receiving portion 62) in the embodiment is provided on substrate stage driving mechanism PSTD for moving substrate table PT. Guided members 50 are movable members that being driven by Y-linear motors 48, and move along with X-guide stage 44 relative to base member 41. Thus, it is configured such that detecting device 60 (light projecting portion 61 and light receiving portion 62) is attached to the movable members (guided members 50), which are movable relative to base member 41.

As shown in FIG. 3, a plurality of (in the embodiment, two) light projecting portions 61 are disposed on first guided member 50A side by side along the Y-axis-direction, and a plurality of (two) light receiving portions 62 are disposed on guided member 50B side by side along the Y-axis-direction so as to correspond to light projecting portions 61. Further, it is configured such that first guided member 50A, which supports light projecting portions 61, and guided member 50B, which supports light receiving portions 62, move synchronously by driving Y-linear motors 48,.

Figure 4:
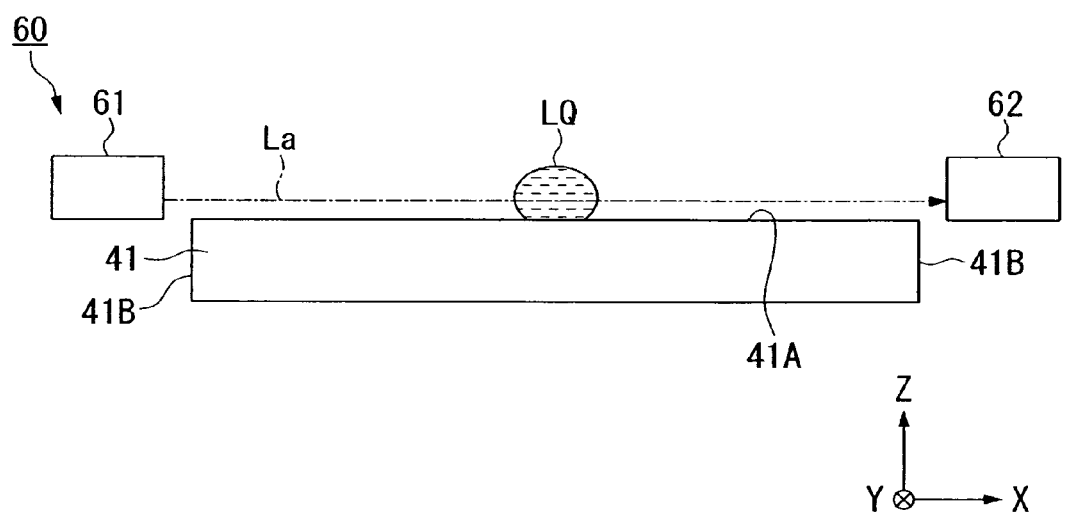
FIG. 4 is a diagram for illustrating the condition where a detecting device is detecting a liquid.

FIG. 4 is a side view schematically showing the positional relationship between detecting device 60 and base member 41. As shown in FIG. 4, detecting light La emitted from light projecting portion 61 of detecting device 60 proceeds in a direction substantially parallel to upper surface 41A of base member 41. And then, based on the detection results from light receiving portion 62, detecting device 60 detects whether there is liquid LQ on upper surface 41A of base member 41.

Light projecting portion 61 and light receiving portion 62 face each other, and it is configured such that detecting light La emitted from light projecting portion 61 reaches light receiving portion 62, and detecting light La is received by light receiving portion 62 at a predetermined level of light amount (light intensity). In this configuration, if, as shown in FIG. 4, when a liquid drop (water drop) of liquid LQ is present on upper surface 41A of base member 41, detecting light La illuminates liquid LQ, then detecting light La is refracted, scattered, or absorbed by liquid LQ. Accordingly, when there is liquid LQ on the optical path of detecting light La, the light amount (light intensity) received by light receiving portion 62 decreases, or detecting light La does not reach light receiving portion 62. Thus, based on the light receiving results of (the amount of light received by) light receiving portion 62, detecting device 60 can detect whether there is liquid LQ on the optical path of detecting light La. And thus, by detecting whether there is liquid LQ on the optical path of detecting light La, detecting device 60 can detect whether there is liquid LQ on upper surface 41A of base member 41.

Since, in the embodiment, it is configured such that detecting device 60 detects liquid LQ optically (in a non-contact manner), there is no need to dispose wirings or various kinds of devices in the vicinity of, e.g., base member 41 or substrate stage driving mechanism PSTD. Thus, the amount of influence on the movements of substrate table PT and substrate stage driving mechanism PSTD can be reduced.

While as detecting light La, a visible light or the like can be used, it is preferable that an infrared light having a predetermined wavelength (predetermined wavelength-band) is used. Specifically, it is preferable that an infrared light having a wavelength of approximately 1200 nm, approximately 1450 nm, approximately 1940 nm, or approximately 2950 nm is used. Water (liquid) LQ has a property of absorbing a light having any one of the above-mentioned wavelengths (infrared light). Thus, when detecting light La having such a wavelength (infrared light) illuminates liquid LQ, the light energy of detecting light La is absorbed by water (liquid) LQ, the light amount received by light receiving portion 62 significantly decreases. Accordingly, the difference between the amount of light received by light receiving portion 62 when detecting light La illuminates liquid LQ and the amount of light received by light receiving portion 62 when detecting light La does not illuminate liquid LQ becomes larger. Thus detecting device 60 can detect more highly sensitively whether there is liquid LQ. It is to be noted that in the case where as detecting light La, an infrared light having the above-mentioned wavelength is used, it may be configured such that a two-wavelength laser light in which, for example, an infrared light having a wavelength of approximately 1940 nm (2 μm-band laser light) and an infrared light having a wavelength of approximately 2950 nm (3 μm-band laser light) are combined illuminates liquid LQ. Alternatively, it may also be configured such that a detecting light in which a plurality of (three or more) laser lights having different wavelengths (wavelength-bands) are combined illuminates liquid LQ.

Meanwhile, in the above-described embodiment, it is configured such that detecting light La proceeds in the direction substantially parallel to upper surface 41A of base member 41 and that by detecting whether there is liquid La on the optical path of detecting light La, it is detected whether there is liquid LQ on base member 41. Therefore, when there is liquid LQ on base member 41, liquid LQ must be assuredly illuminated by detecting light La. For this purpose, detecting device 60 is configured such that in order to assuredly illuminate by detecting light La liquid LQ existing on base member 41, detecting light La passes inside a region located within a predetermined distance from the surface of base member 41 and separated from the surface. Specifically, detecting light La is set to pass through a region located within a distance of 5.5 mm from upper surface 41A of base member 41 and separated from the upper surface. This will be described referring to FIG. 5.

Figure 5:
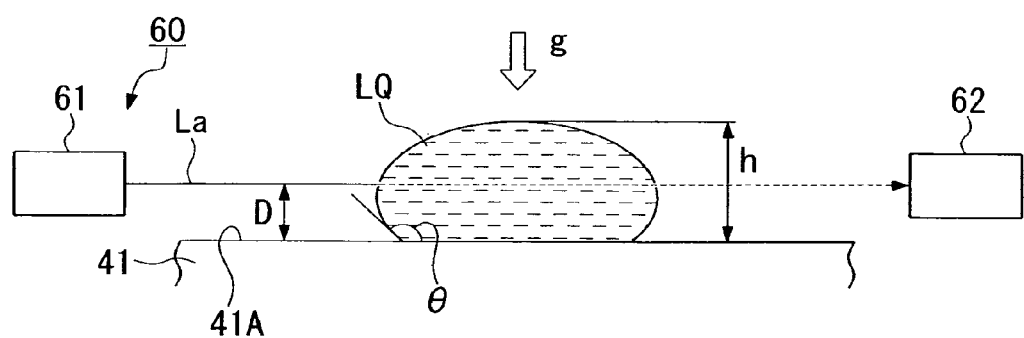
FIG. 5 is a diagram showing the positional relationship between a detecting light and the surface of a base member.

In FIG. 5, liquid LQ in a state of liquid drop (water drop) is arranged on upper surface 41A of base member 41. In this case, the following formula holds:

$$\cos \theta = 1 - (\rho \times g \times h^2)/(2 \times T), \quad (1A)$$

where θ is the contact angle of liquid LQ relative to the object surface, ρ is the density of the liquid, h is the height of the liquid (liquid drop), T is the surface tension coefficient, and g is the gravitational constant.

Since, in the embodiment, liquid LQ is water, ρ=998[kg/m³] and T=73×10⁻³[N/m] hold. By transforming the above formula (1A), the following formula results:

$$h = [(2 \times T) \cdot (1 - \cos \theta)/\rho \times g]^{1/2}. \quad (2A)$$

When assuming θ=180° (cos θ=−1), h=5.46×10⁻³[m], i.e., approximately 5.5 mm results. Actually, since the contact angle θ is smaller than 180°, the value of the height h also becomes smaller than 5.5 mm. Thus, by setting the distance D between upper surface 41A of base member 41 and detecting light La proceeding in the direction substantially parallel to upper surface 41A less than 5.5 mm, detecting light La can assuredly illuminate liquid LQ existing on upper surface 41A of base member 41.

Next, the method for exposing substrate P by using the above-described exposure apparatus EX will be described. In order to expose substrate P loaded on substrate table PT, controller CONT drives liquid immersion mechanism 1 to form liquid LQ's liquid immersion region AR2 on substrate P. Further, controller CONT illuminates mask M with exposure light EL by using illumination optical system IL and projects the pattern image of mask M onto substrate P via projection optical system PL and liquid LQ. As described above, exposure apparatus EX of the embodiment scan-exposes the pattern formed on mask M onto substrate P while synchronously moving mask M and substrate P. As shown in FIG. 2 and FIG. 3, a plurality of shot areas SH are set on substrate P in a matrix manner. After completion of exposure of one shot area SH, the next shot area SH is moved, through the stepping movement of substrate P, to the scan-start-position and then exposed. Thereafter, with substrate P being moved in the step-and-scan manner, the scanning-exposure processes for each of the remaining shot areas are successively performed. In order to move substrate table PT supporting substrate P, controller CONT drives X-linear motor 47 and Y-linear motors 48, which constitute substrate stage driving mechanism PSTD. Further, being associated with the drive of Y-linear motors 48, guided member 50 (50A, 50B) supporting detecting device 60 also moves relative to base member 41. Here, detecting light La is always emitted from light projecting portion 61 of detecting device 60 before, during, and after exposure of substrate P.

Figure 6:
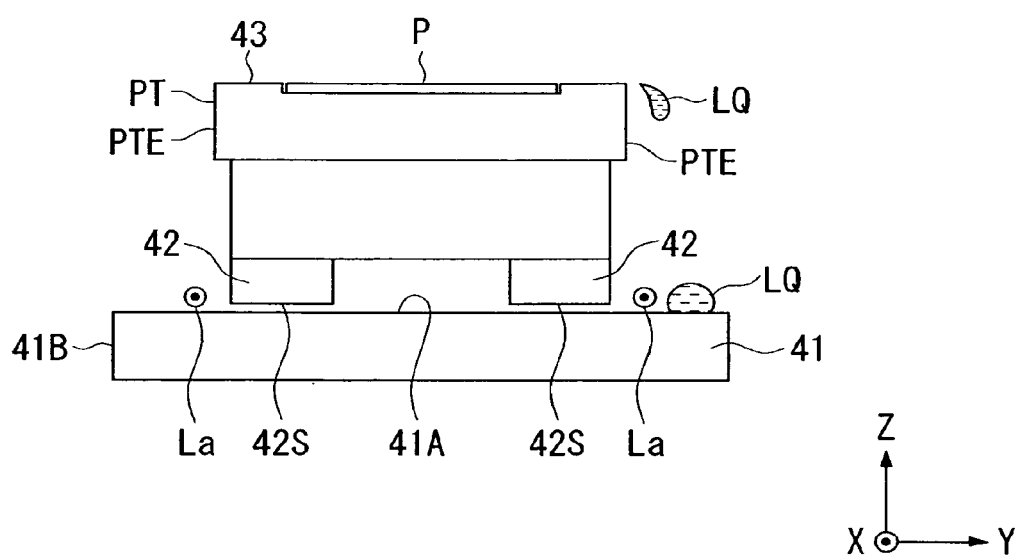
FIG. 6 is a drawing for illustrating an example of the irradiating position of the detecting light.

As shown in the schematic of FIG. 6, there is a possibility that liquid LQ flows out from on substrate table PT (substrate P), and the liquid LQ having flowed out stays on upper surface 41A of base member 41. Since controller CONT is always emitting detecting light La from light projecting portion 61 of detecting device 60, controller CONT can detect whether there is liquid LQ on upper surface 41A of base member 41. Here, two light projecting portions 61 are disposed side by side along the Y-axis-direction, and two light receiving portions 62 are disposed side by side along the Y-axis-direction; as shown in FIG. 6 and FIG. 3, it is configured such that the detecting lights La emitted from light projecting portions 61 pass near edge portions PTE of substrate table PT. Liquid LQ flowing out from substrate table PT flows out from edge portions PTE of substrate table PT onto base member 41. Thus, by making the detecting lights La proceed near edge portions PTE of substrate table PT, the liquid LQ flowing out from on substrate table PT can be detected promptly and satisfactorily. In the step-and-scan movement when exposing substrate P, the movement stroke may be small. In such case, when it is configured such that detecting light La proceeds through a portion distant from edge portion PTE of substrate table PT, there arises a possibility that it takes a long time from the time point at which liquid LQ flowed out onto base member 41, to the time point at which liquid LQ is detected by the detecting light La, and thus the damage may spread. However, by setting the optical path of detecting light La to be located to align with the position to which liquid LQ is apt to flow out, liquid LQ flowing out can be detected promptly and satisfactorily.

In addition, during the exposure processes, guided member 50, which supports detecting device 60 (light projecting portion 61 and light receiving portion 62), is relatively moving relative to base member 41. First guided member 50A, which supports floodlighting portion 61, and guided member 50B, which supports light receiving portion 62, are synchronously moved. While synchronously moving first guided member 50A, which supports floodlighting portion 61, and guided member 50B, which supports light receiving portion 62, controller CONT emits detecting light La from light projecting portion 61 supported by first guided member 50A and detects whether there is liquid LQ on upper surface 41A of base member 41. Since, in this way, while relatively moving detecting light La and base member 41 by moving detecting device 60 relative to base member 41, controller CONT detects whether there is liquid LQ on upper surface 41A of base member 41, controller CONT can, by using detecting device 60, detect whether there is liquid LQ with respect to a relatively large region in upper surface 41A of base member 41.

Further, by emitting detecting light La while relatively moving detecting light La and base member 41 in a state that there is liquid LQ on upper surface 41A of base member 41, liquid LQ's position on base member 41 can be determined. More specifically, since guided member 50 and substrate table PT move substantially together with respect to the Y-axis-direction, the position of guided member 50, to which detecting device 60 is provided, can be measured by measuring the position of substrate table PT by using laser interferometer 46. Thus, by emitting detecting light La, while moving guided member 50 with the position of guided member 50 (i.e., the position of detecting device 60) being monitored, controller CONT can, based on position measurement results from laser interferometer 46 and on the amount of light received by light receiving portion 62 of detecting device 60, determine the position of liquid LQ in the coordinate system defined by laser interferometer 46.

Further, when detecting device 60 detects liquid LQ, controller CONT judges based on the detection results from detecting device 60 that a problem occurred, e.g., a problem that liquid LQ has flowed out from on substrate table PT. When controller CONT has judged that a problem had occurred, controller CONT, for example, decreases the per-unit-time liquid supply amount by liquid supply mechanism 10 or stops supplying liquid LQ by liquid supply mechanism 10. When stopping supplying liquid LQ by liquid supply mechanism 10, the drive of liquid supply portion 11 may be stopped, or the flow path of supply pipe 13 may be closed by using valve 15. Alternatively, based on the detection results from detecting device 60, controller CONT increases the per-unit-time liquid recovery amount by liquid recovery mechanism 20. Alternatively, based on the detection results from detecting device 60, controller CONT stops the exposure operation on substrate P and/or the movement of substrate stage PST. In this way, by detecting, by using detecting device 60, whether there is liquid LQ on base member 41 and then by, based on the detection results, controlling the exposure operation, liquid supply/recovery operations, etc., it can be prevented that liquid LQ flows out onto, e.g., floor face FD, and the damage spreads.

Further, when there is liquid LQ on base member 41, liquid LQ may flow into air suction ports 42A of air bearings 42; thus, when liquid LQ is detected, controller CONT may stop the sucking operation through air suction ports 42A. Further, by arranging the optical path of detecting light La to be located near air bearings 42, liquid LQ can be detected by using detecting light La before liquid LQ on base member 41 flows into air suction ports 42A. Therefore, by taking an appropriate step depending on the detection results, it can be precluded that liquid LQ having flowed out onto base member 41 flows into air suction ports 42A. Further, when liquid LQ penetrates between bearing surfaces 42S of air bearings 42 and upper surface 41A of base member 41, the Z-direction position of substrate table PT may vary due to liquid LQ. However, by taking an appropriate step depending based on the detection results from detecting device 60, such a disadvantage can also be prevented.

Further, when controller CONT judges that the detection results from detecting device 60 indicate a problem, controller CONT may raise an alarm by driving alarm device K. Since, by doing so, an operator, for example, can recognize that a problem has occurred, e.g., that liquid LQ has leaked inside exposure apparatus EX, he or she can take an appropriate step. Alarm device K may raise an alarm by using a warning light, a warning sound, a display, or the like.

It should be noted that while, here, detecting device 60 detects liquid LQ by moving the detection region of detecting device 60 (the optical path of detecting light La) in cooperation with the step-and-scan movement of substrate P, it may also be configured such that after exposing the first shot area and before exposing the next second shot area, it is detected whether there is liquid LQ on upper surface 41A of base member 41, while guided member 50 is moved in a movement condition different from the step movement. For example, it may be configured such that after exposing the first shot area, a detection operation is performed with respect to a relatively large region on upper surface 41A of base member 41 by moving guided member 50 by a distance larger than the step movement distance, and thereafter the second shot area is exposed. By doing so, before exposing the second shot area, it can be recognized whether there is liquid LQ on base member 41, and thus, after ascertaining that liquid LQ is absent, the second shot area can be exposed. Further, when liquid LQ is present, an appropriate step can be taken before exposing the second shot area.

It is to be noted that the detection operation by detecting device 60 may be performed before the-liquid-immersion-exposure for substrate P or before liquid LQ is supplied onto substrate P. For example, after ascertaining, before performing the liquid-immersion-exposure, that liquid LQ is absent on base member 41, the liquid-immersion-exposure process can be performed.

After completion of the liquid-immersion-exposure of substrate P, controller CONT recovers, by using liquid recovery mechanism 20 etc., liquid LQ on substrate P or liquid LQ that stays on top face 43 of substrate table PT. After recovering liquid LQ on substrate table PT, including the surface of substrate P, controller CONT can detect, by using detecting device 60, whether there is liquid LQ on base member 41. In this case, since the exposure process on substrate P is complete, detecting device 60 can be positioned at a desired position on base member 41 by moving, e.g., guided member 50 by a large distance.

Figure 7:
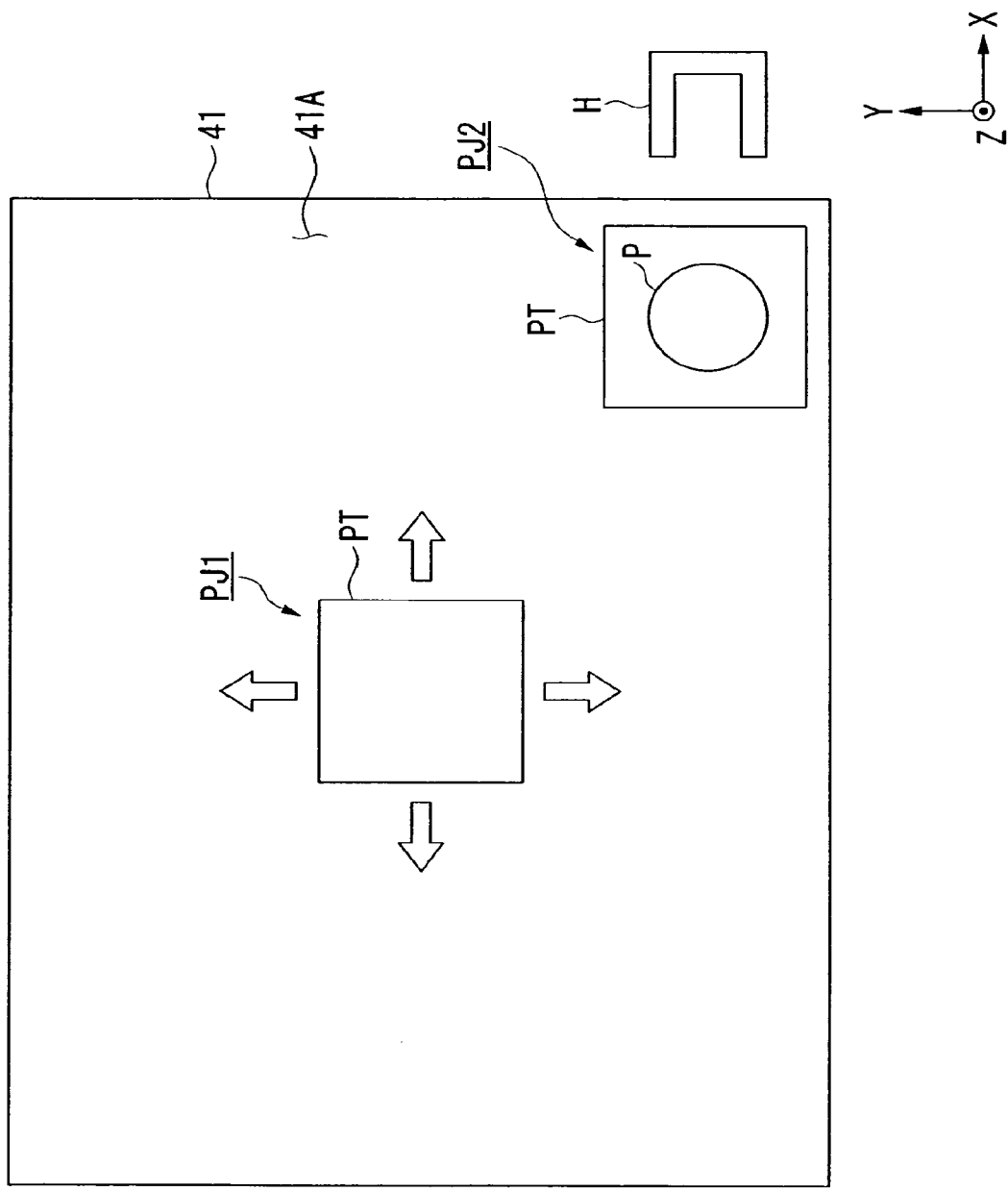
FIG. 7 is a drawing for illustrating the condition where the substrate table moves between an exposure position and an unload position.

Next, controller CONT carries out (unloads) substrate P having been exposed from substrate stage PST. When unloading (carrying out) or loading (carrying) substrate P, controller CONT moves guided member 50 by a large distance relative to base member 41 in order to move substrate table PT between exposure position PJ1 and load/unload position PJ2, as shown in the schematic of FIG. 7. Therefore, by using detecting device 60 supported by guided member 50, controller CONT can detect liquid LQ with respect to a relatively large region on base member 41.

Next, substrate P, which has been exposed, on substrate table PT, which has been moved to load/unload position PJ2, is delivered to conveyance system H. It is to be noted that it may also be configured such that controller CONT, after loading substrate P, which is not yet exposed, on substrate table PT at load/unload position PJ2 and before moving substrate table PT to exposure position PJ1, or after unloading substrate P, which has been exposed, from substrate table PT at load/unload position PJ2 and before loading substrate P, which is not yet exposed, moves a movable member (in this case, guided member 50) supporting detecting device 60 by a large distance relative to base member 41 and detects whether there is liquid LQ on upper surface 41A of base member 41.

As described above, there is provided detecting device 60 for detecting whether there is liquid LQ on upper surface 41A of base member 41, which guides the movement of substrate table PT. Thus, when detecting device 60 detects liquid LQ, appropriate steps, e.g., a step to remove liquid LQ can be promptly taken. Therefore, the damage due to liquid LQ having flowed out is prevented from spreading, and the exposure processes and the measurement processes can be performed satisfactorily.

Further, with detecting device 60 capable of detecting liquid LQ being supported and moved by guided member 50 which is a movable member, it can be detected whether there is liquid LQ with respect to a relatively large region on a member (base member 41), which is other than guided member 50. Thus, the damage due to liquid LQ having flowed out is prevented from spreading, and the exposure processes and the measurement processes can be performed satisfactorily.

It is to be noted that while, in the embodiment, it is configured such that each of light projecting portion 61 and light receiving portion 62 is disposed, with respect to the X-axis-direction, on each of the positions between which base member 41 exists, and that by moving guided member 50 in the Y-axis-direction while emitting detecting light La from light projecting portion 61, liquid LQ's Y-axis-direction position on base member 41 other than guided member 50, is detected. However, by disposing each of light projecting portion 61 and light receiving portion 62, with respect to the Y-axis-direction, also on each of the positions between which base member 41 exists and by, with light projecting portion 61 and light receiving portion 62 being supported by movable members that can relatively move relative to base member 41, emitting detecting light La from light projecting portion 61 while synchronously moving light projecting portion 61 and light receiving portion 62 in the X-axis-direction, the position of liquid LQ in the X-axis-direction on base member 41 can also be detected. Further, while, in the embodiment, two light projecting portions 61 and two light receiving portions 62 are provided, but, of course, any plural number of each of these portions may be provided, or only one thereof may be provided.

Figure 8:
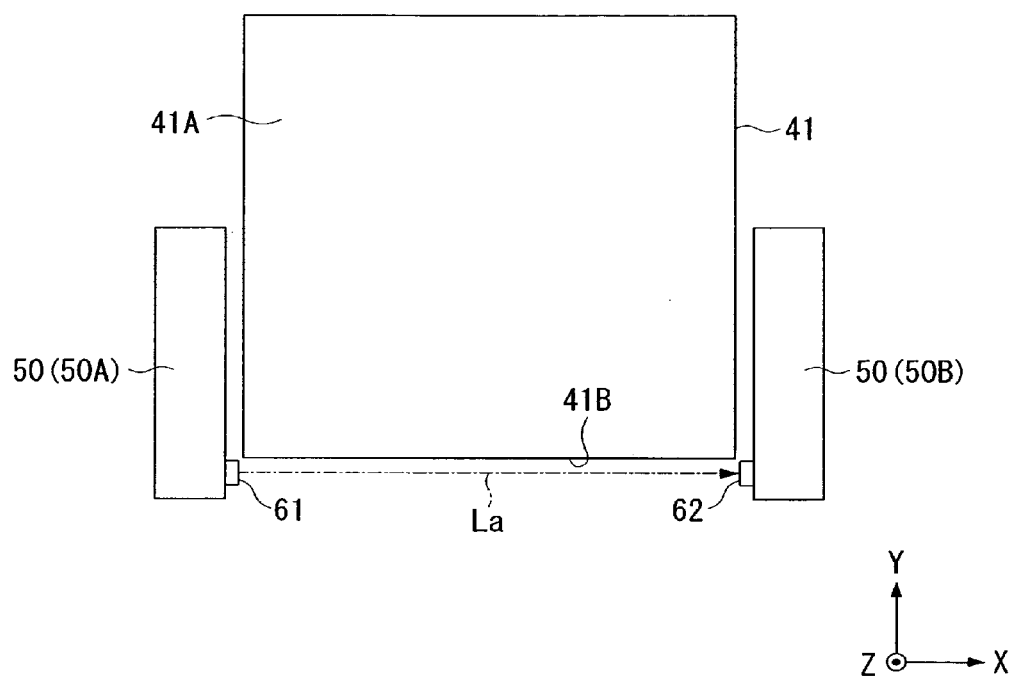
FIG. 8 is a drawing showing another condition where the detecting device is detecting a liquid.

It is to be noted that in the above-described embodiment, detecting device 60 detects whether there is liquid LQ on upper surface 41A of base member 41, but by changing the attaching position of detecting device 60 on guided member 50 to a position that is different from that in the above-described embodiment or by attaching a new detecting device 60, liquid LQ on side surface 41B of base member 41 can also be detected, as shown in the plan view of FIG. 8.

Figure 9:
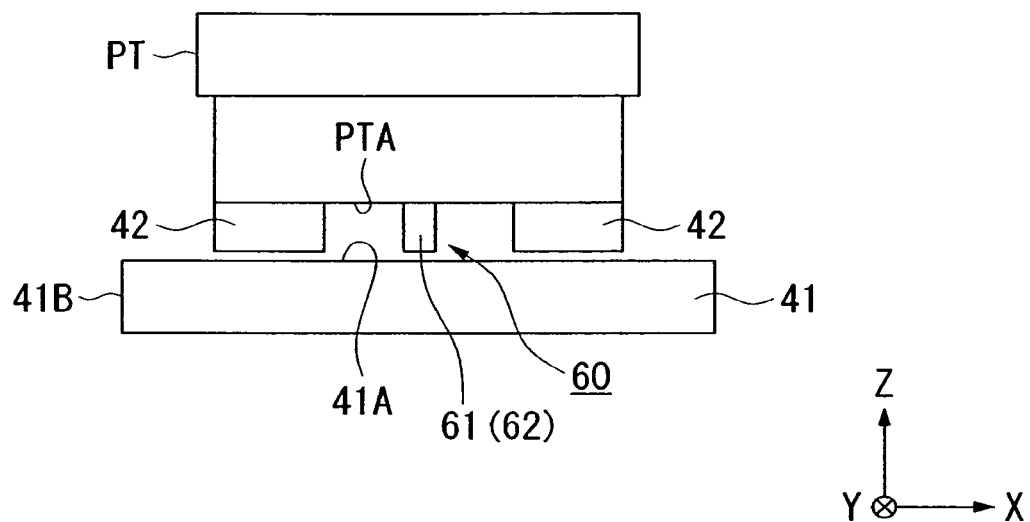
FIG. 9 is a drawing showing a modified example of the setting position of the detecting device.
Figure 10:
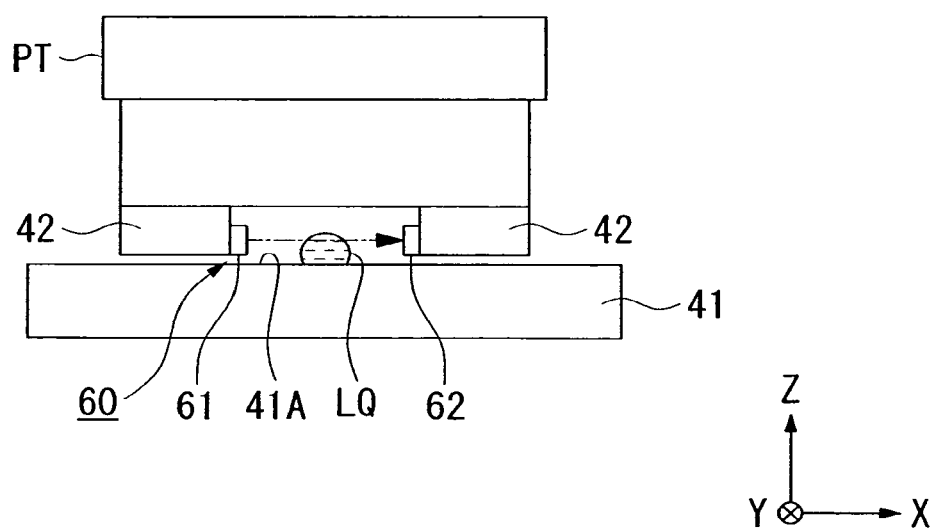
FIG. 10 is a drawing showing a modified example of the setting position of the detecting device.

It is to be noted that while, in the above-described embodiment, detecting device 60 is attached to guided member 50, detecting device 60 may be attached to any member constituting substrate stage driving mechanism PSTD. Alternatively, it may also be configured such that a movable member which is other than substrate stage driving mechanism PSTD and is relatively movable relative to base member 41 is provided, and detecting device 60 is attached to the movable member. For example, as shown in FIG. 9, light projecting portion 61 and light receiving portion 62 may be provided on substrate table PT's undersurface PTA, which faces upper surface 41A of base member 41. In the example shown in FIG. 9, light projecting portion 61 is attached to the −Y side edge region on substrate table PT's undersurface PTA, and light receiving portion 62 is attached, so as to face light projecting portion 61, to the +Y side edge region on substrate table PT's undersurface PTA. Further, as shown in FIG. 10, light projecting portion 61 and light receiving portion 62 may be provided on air bearings 42 for supporting in a non-contact manner substrate table PT relative to upper surface 41A of base member 41. In this embodiment, each of air bearings 42 is provided on each of a plurality of position on substrate table PT's undersurface PTA; light projecting portion 61 is provided on the side surface of a first air bearing among the plurality of air bearings 42, and light receiving portion 62 is provided, so as to face light projecting portion 61, on the side surface of a second air bearing, which is other than the above-mentioned first bearing.

Further, in the above-described embodiment, it is detected whether liquid LQ is attaching on base member 41 having upper surface 41A, which guides the movement of substrate table PT. However, of course, it can be detected, by using detecting device 60 attached to a movable member, whether liquid LQ is attaching to any member that constitutes exposure apparatus EX and is other than base member 41. Further, by using such detecting device 60, it can be detected whether there is liquid LQ on surface plate 4, on which base member 41 is set, or on floor face FD.

Figure 11:
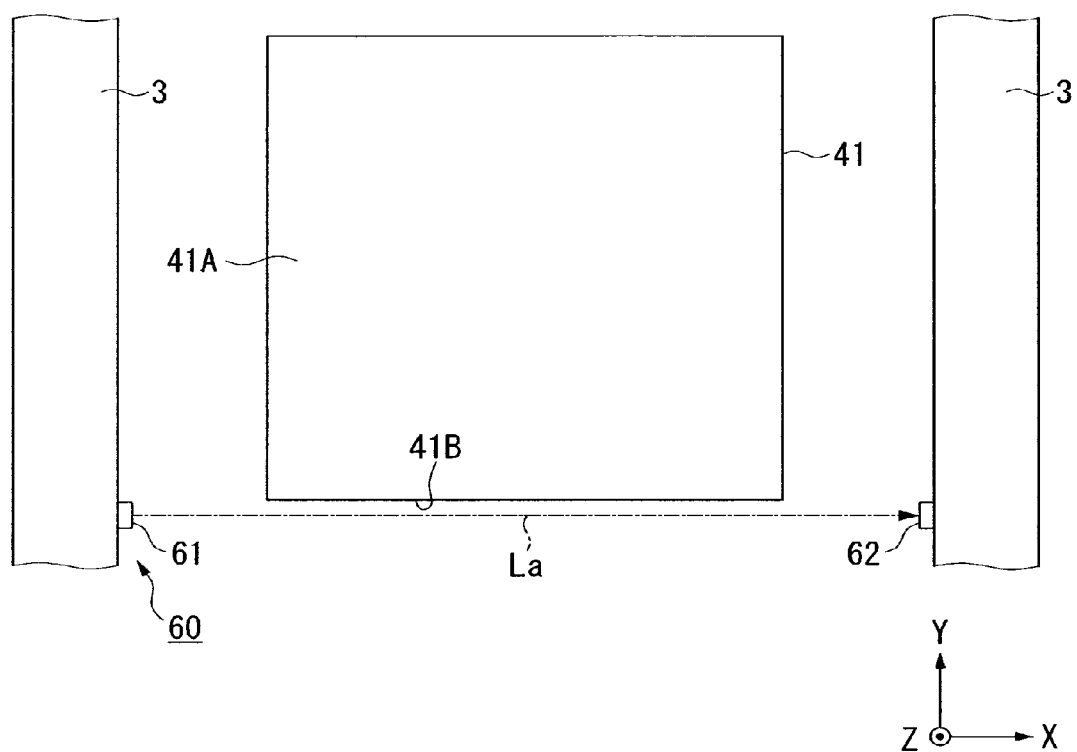
FIG. 11 is a drawing showing a modified example of the setting position of the detecting device.

Further, detecting device 60, which detects whether there is liquid LQ on base member 41, may be attached to a fixed member that does not substantially move relative to base member 41. For example, in the example shown in FIG. 11, light projecting portion 61 and light receiving portion 62 of detecting device 60 are attached to main column 3 so as to face each other, with base member 41 existing therebetween. With such a configuration also, it can be detected, by using detecting device 60, whether there is liquid LQ on base member 41. In addition, by optimizing the attaching positions of light projecting portion 61 and light receiving portion 62 on main column 3 and by using such light projecting portion 61 and light receiving portion 62, it can be determined whether there is liquid LQ on base member 41 of base member 41, also whether there is liquid LQ on side surface 41B of base member 41, or also whether there is liquid LQ on surface plate 4 or floor face FD. Of course, by using light projecting portion 61 and light receiving portion 62 attached to main column 3, it can be detected whether there is liquid LQ on any member or device that constitutes exposure apparatus EX and is other than base member 41.

It is to be noted that, in the above-described embodiment, detecting device 60 detects liquid LQ for forming liquid immersion region AR2, but there is a possibility that in exposure apparatus EX, a liquid that is other than liquid LQ for forming liquid immersion region AR2, e.g., a cooling liquid that cools a linear motor, flows out onto, e.g., base member 41. Detecting device 60 can also detect such a liquid (e.g., a cooling liquid).

Next, another embodiment will be described. In the following description, the same or equivalent constituent elements as those in the above-described embodiment are denoted by the same reference letters or numerals, and their descriptions will be abridged or omitted.

Figure 12:
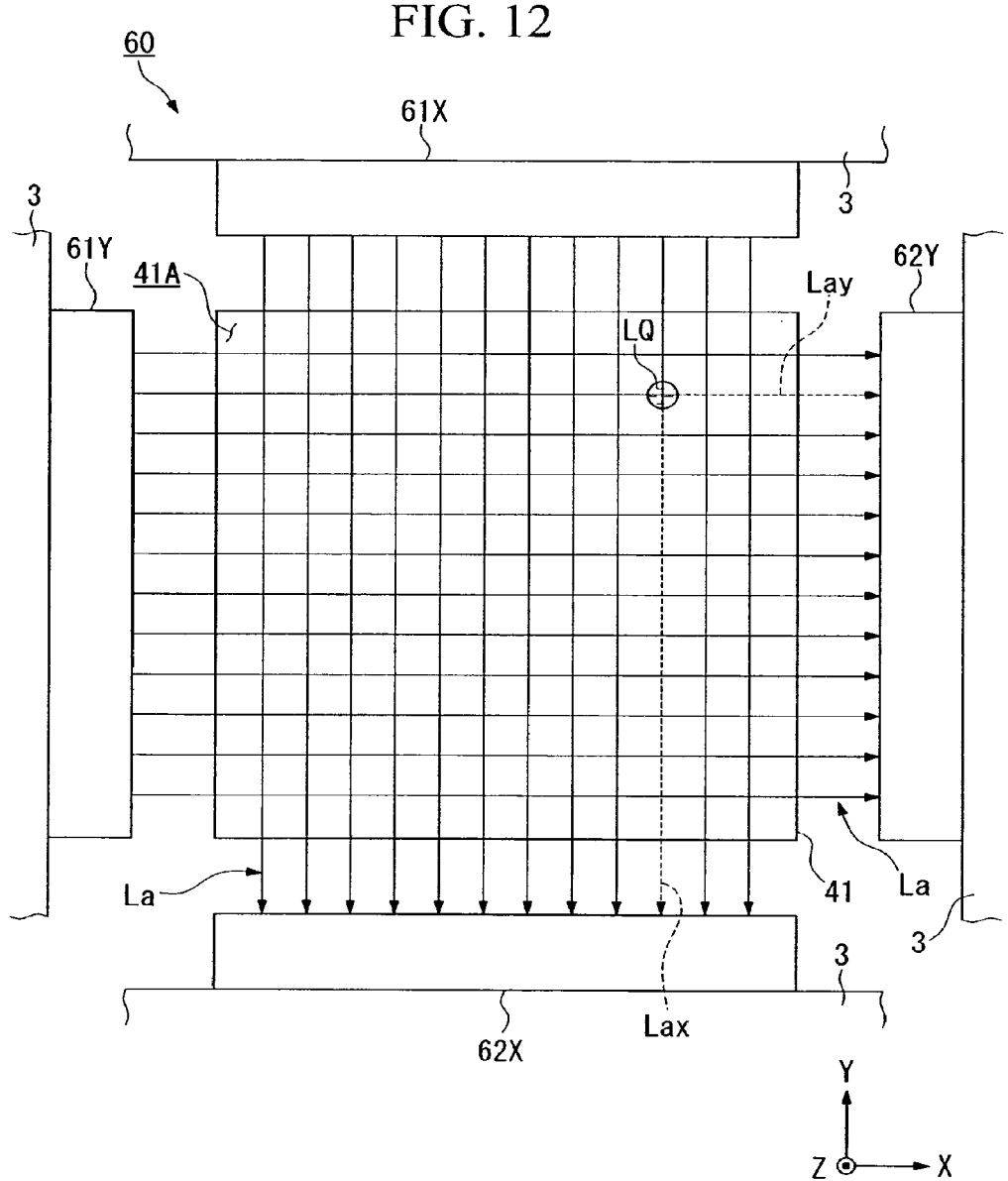
FIG. 12 is a drawing showing another embodiment of the detecting device.

By emitting a plurality of detecting lights La in a matrix manner as shown in FIG. 12, the position of liquid LQ on base member 41 can be determined. In FIG. 12, detecting device 60 comprises first emitting portion 61X that is disposed on the +Y side of base member 41 and emits a plurality of detecting lights La aligned side by side with the X-axis-direction, with first light receiving portion 62X that is disposed on the −Y side of base member 41 and is disposed in a predetermined position relative to detecting lights La emitted from first emitting portion 61X, with second emitting portion 61Y that is disposed on the −X side of base member 41 and emits a plurality of detecting lights La aligned side by side with the Y-axis-direction, and second light receiving portion 62Y that is disposed on the +X side of base member 41 and is disposed in a predetermined position relative to detecting lights La emitted from second emitting portion 61Y. First light receiving portion 62X has a plurality of light receiving devices that correspond to the plurality of detecting lights La emitted from first emitting portion 61X, and, similarly, second light receiving portion 62Y has a plurality of light receiving devices that correspond to the plurality of detecting lights La emitted from second emitting portion 61Y. Each of detecting lights La emitted from first emitting portion 61X and detecting lights La emitted from second emitting portion 61Y proceeds in a direction substantially parallel to upper surface 41A of base member 41, and the optical paths of these detecting lights La are set in a matrix manner, as viewed from the top. With this setting, when, as shown in FIG. 12, there is liquid LQ on the optical path of a specific detecting light Lax, among the plurality of detecting lights La emitted from first emitting portion 61X, the light amount received by a light receiving device, among the plurality of light receiving devices of first light receiving portion 62X, which corresponds to the detecting light Lax decreases. Similarly, when there is liquid LQ on the optical path of a specific detecting light Lay, among the plurality of detecting lights La emitted from second emitting portion 61Y, the light amount received by a light receiving device, among the plurality of light receiving devices of second light receiving portion 62Y, which corresponds to the detecting light Lay decreases. Based upon the light-reception results of each of first light receiving portion 62X and second light receiving portion 62Y, controller CONT can identify that the position of liquid LQ is located near the intersection point between detecting light Lax and detecting light Lay. Here, since the positional information of the light receiving devices, which receive detecting light Lax or detecting light Lay, is known beforehand from design values etc., controller CONT can, based upon the positional information of the light receiving devices, which have received detecting light Lax or detecting light Lay, determine the position of liquid LQ on base member 41.

Figure 13:
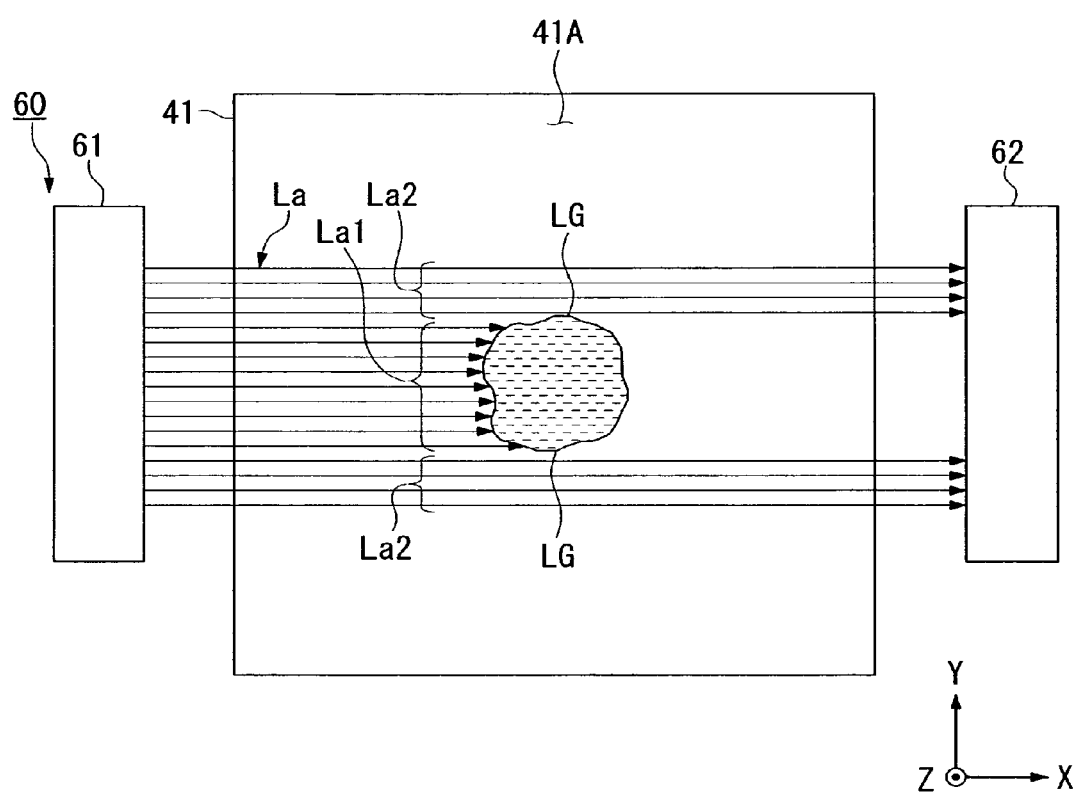
FIG. 13 is a drawing showing another embodiment of the detecting device.

Further, as shown in FIG. 13, based upon the light receiving results from light receiving portion 62 when detecting light La is emitted from each of a plurality of positions on emitting portion 61, detecting device 60 can determine the size of liquid LQ existing on base member 41 (the size of the region covered by liquid LQ).

In the example shown in FIG. 13, emitting portion 61 emits along the X-axis-direction a plurality of detecting lights La aligned side by side with the Y-axis-direction. Light receiving portion 62 has a plurality of light receiving devices that correspond the plurality of detecting lights La. The positional information of these light receiving devices is known beforehand from design values etc. When partial detecting lights La1, among the plurality of detecting lights La emitted from light projecting portion 61, illuminate liquid LQ, detecting lights La1 do not reach light receiving devices of the light receiving portion 62 corresponding to detecting lights La1, or the light amounts received by those light receiving devices decrease. In contrast, the other detecting lights La2 reach light receiving portion 62 without via liquid LQ. Thus, based upon the light receiving results of the light receiving devices, which has received detecting lights La1, of the light receiving portion 62 and upon the positional information of those light receiving devices, detecting device 60 can detect edge portions LG of liquid LQ and determine the size of liquid LQ (the region covered by liquid LQ).

Figure 14:
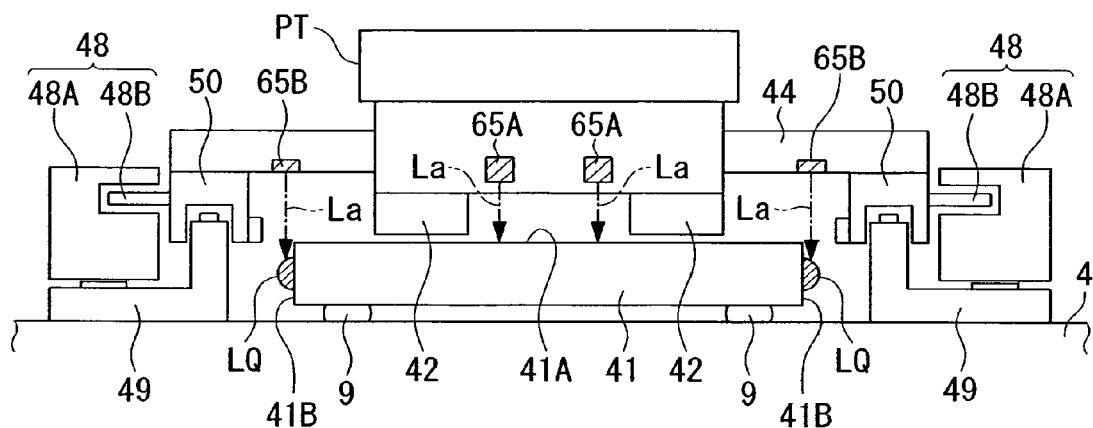
FIG. 14 is a drawing showing another embodiment of the detecting device.

Detecting device 65A shown in FIG. 14 has both of a function of a emitting portion for emitting detecting light La and a function of a light receiving portion for receiving the light. And, detecting device 65A is provided on the side surface of substrate table PT. Detecting device 65A illuminates upper surface 41A of base member 41 from thereabove with detecting light La, receives, at the same time, the light from upper surface 41A of base member 41, and detects, based upon the light receiving results, whether there is liquid LQ on upper surface 41A of base member 41. When liquid LQ is absent on upper surface 41A of base member 41, the reflection light arising from detecting light La illuminating upper surface 41A of base member 41 is received by detecting device 65A at a predetermined level of light intensity. In contrast, since when liquid LQ is present on upper surface 41A of base member 41, detecting light La illuminating upper surface 41A of base member 41 is scattered or absorbed by liquid LQ, the reflection light thereof is received by detecting device 65A at a level of light intensity lower than the predetermined level of light intensity. Based upon the light receiving results with respect to the reflection light, detecting device 65A can detect whether there is liquid LQ on upper surface 41A of base member 41. Further, in FIG. 14, on the undersurface of X-guide stage 44 is provided detecting device 65B that has an equivalent configuration with that of detecting device 65A. It is configured such that detecting light La emitted from detecting device 65B proceeds near side surface 41B of base member 41. When liquid LQ is absent on side surface 41B of base member 41, detecting light La emitted from detecting device 65B is reflected by surface plate 4 and then received by detecting device 65B at a predetermined level of light intensity. In contrast, since when liquid LQ is present on side surface 41B of base member 41, the reflection light thereof is received by detecting device 65B at a level of light intensity lower than the predetermined level of light intensity, detecting device 65B can detect whether there is liquid LQ on side surface 41B of base member 41. It is to be noted that in the embodiment of FIG. 14 also, the detecting process can be performed while moving substrate table PT supporting detecting device 65A and/or X-guide stage 44 supporting detecting device 65B. Further, also in this case, by using an infrared light having a predetermined wavelength as detecting light La, the accuracy of detecting liquid LQ can be improved.

Figure 15:
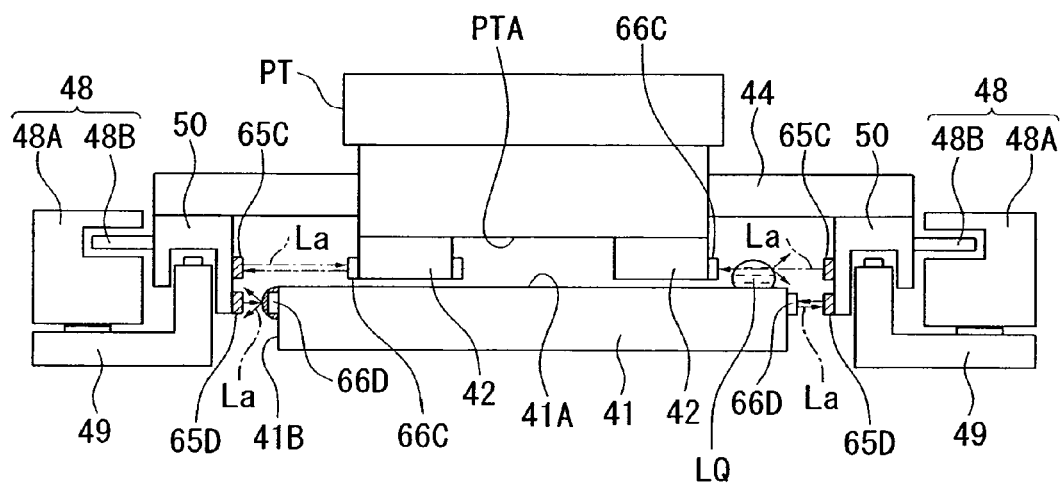
FIG. 15 is a drawing showing another embodiment of the detecting device.

Detecting device 65C shown in FIG. 15 has an equivalent configuration with that of the above-described detecting device 65A and is attached to guided member 50. And, detecting lights La from detecting devices 65C illuminate the side surfaces of air bearings 42 attached to undersurface PTA of substrate table PT. In this regard, mirrors 66C that have a reflecting surface that reflects detecting light La are provided on the side surfaces of air bearings 42. With the minor being provided, when liquid LQ is absent on the optical path of detecting light La, the reflection light of detecting light La, from detecting device 65C, illuminating the minor is received by detecting device 65C at a high level of light intensity. For this reason, the difference of the received light amount between the case when liquid LQ is present on the optical path of detecting light La and the case when liquid LQ is absent thereon becomes large. Thus liquid LQ can be detected more highly sensitively. Similarly, on guided members 50 are provided detecting devices 65D that have an equivalent configuration with that of the above-described detecting device 65A and illuminate side surfaces 41B of base member 41 with detecting lights La, and on side surfaces 41B of base member 41 are provided mirrors 66D that have a reflecting surface. By illuminating side surface 41B of base member 41, on which minor 66D is provided, with detecting light La, detecting device 65D can detect highly sensitively whether there is liquid LQ on side surface 41B. Further, it is of course feasible that by attaching a detecting device that has an equivalent configuration with that of the above-described detecting device 65A on, e.g., guided member 50 and by illuminating the side surface of substrate table PT with a detecting light, it can be detected whether there is liquid LQ on the side surface of substrate table PT. In this case also, by providing a reflecting surface on the side surface of substrate table PT, it can be highly sensitively whether liquid LQ is present. Further, not only liquid LQ attaching on the side surface of substrate table PT, but also liquid LQ that has flowed out from on substrate table PT and runs down along the side surface of substrate table PT can be detected by the detecting device, which can detect the liquid on the side surface of substrate table PT. Thus, when liquid LQ has flowed out from on substrate table PT, the liquid LQ having flowed out can be promptly detected by using the detecting device 65, and an appropriate step can be promptly taken.

Figure 16:
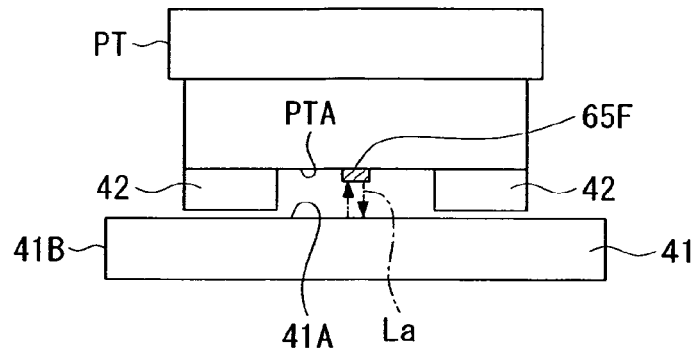
FIG. 16 is a drawing showing another embodiment of the detecting device.

FIG. 16 is a drawing showing a state where detecting device 65F having an equivalent configuration with that of the above-described detecting device 65A is provided on undersurface PTA of substrate table PT. Detecting device 65F illuminates upper surface 41A of base member 41A with detecting light La. In this manner, it may also be configured such that detecting device 65A is provided on undersurface PTA of substrate table PT. It is to be noted that a reflecting surface may be provided on upper surface 41A of base member 41.

Figure 17:
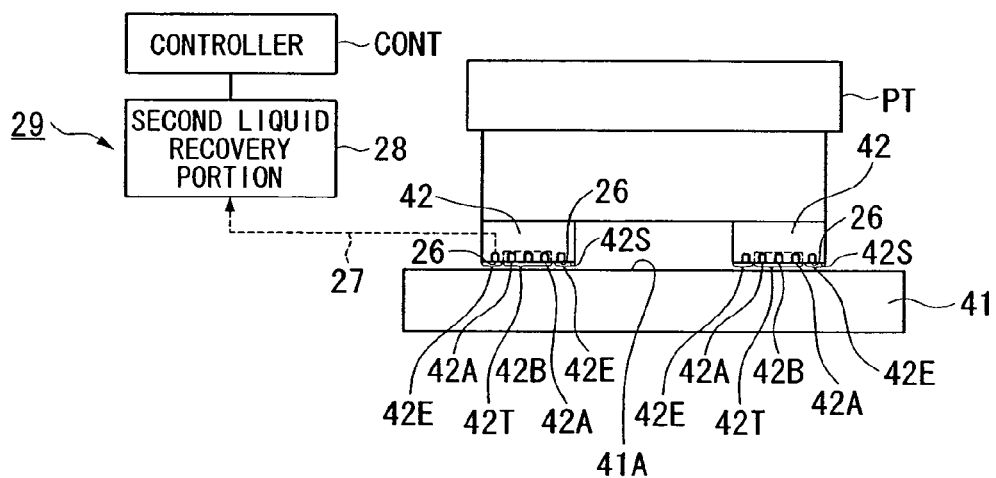
FIG. 17 is a drawing for illustrating a liquid recovery mechanism that recovers a liquid on the base member.
Figure 18:
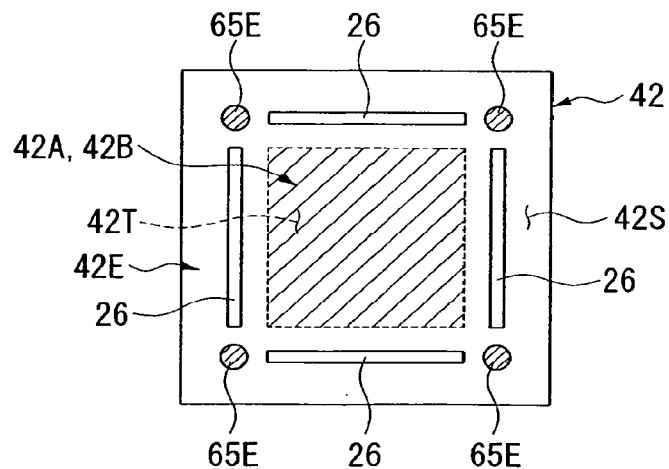
FIG. 18 is a drawing showing the positional relationship between a liquid recovery port provided to an air bearing and the detecting device.

FIG. 17 is a side view schematically showing another embodiment of substrate table; FIG. 18 is a drawing of air bearing 42 viewed from the bearing surface 42S side.

In FIG. 17, on undersurface PTA of substrate table PT are provided air bearings 42 for supporting in a non-contact manner substrate table PT relative to upper surface 41A of base member 41. Further, in air bearings 42's bearing surfaces 42S that face upper surface 41A of base member 41 are provided blowout ports 42B that blow a gas (air) against base member 41's upper surface 41A and air suction ports 42A that suck the gas between bearing surfaces 42S and guide surface 41A. Air suction ports 42A and blowout ports 42B are provided in center regions 42T of bearing surfaces 42S of air bearings 42.

Further, as shown in FIG. 18, detecting devices 65E having an equivalent configuration with that of the above-described detecting device 65A are provided in peripheral regions 42E, of bearing surfaces 42S of air bearings 42, that are other than center regions 42T, in which air suction ports 42A and blowout ports 42B are provided. Each of detecting devices 65E is provided in each of a plurality of predetermined positions in peripheral region 42E, which is located outside center region 42T, so as to surround center region 42T; it is configured such that detecting devices 65E illuminates upper surface 41A of base member 41 with detecting light La and, at the same time, receives the reflection light from upper surface 41A. Thus, detecting device 65E can detect whether there is liquid LQ on upper surface 41A of base member 41. Further, in bearing surface 42S of air bearing 42 are provided liquid recovery ports 26 that are capable of recovering liquid LQ on upper surface 41A of base member 41. Recovery port 26 are provided in peripheral region 42E, of bearing surface 42S, which is located outside center region 42T, in which air suction ports 42A and blowout ports 42B are provided, and each of recovery ports 26 is provided, in peripheral region 42E, in each of a plurality of predetermined positions that are other than the positions where detecting devices 65E are located. As shown in FIG. 17, recovery ports 26 are connected, via recovery flow path 27, to second liquid recovery portion 28. Second liquid recovery portion 28 has an equivalent configuration with that of liquid recovery portion 21 described earlier. And, second liquid recovery mechanism 29 that recovers liquid LQ on base member 41 is constituted by, among other things, second liquid recovery portion 28, recovery flow path 24, and recovery port 26.

Also in the embodiment shown in FIGS. 17 and 18, substrate table PT supporting substrate P and upper surface 41A of base member 41 are relatively moved. When, during, for example, an exposure process, there is liquid LQ on upper surface 41A of base member 41, liquid LQ on upper surface 41A is detected by detecting device 65E. When controller CONT has judged, based upon the detection results from detecting devices 65E, that there is liquid LQ on upper surface 41A of base member 41, controller CONT can, by controlling second liquid recovery mechanism 29, recover liquid LQ on upper surface 41A via recovery port 26. In this configuration, since recovery ports 26 of second liquid recovery mechanism 29 are provided in peripheral region 42E located outside center region 42T having air suction ports 42A, liquid LQ on upper surface 41A can be recovered via recovery port 26 without allowing liquid LQ to flow into air suction ports 42A, while substrate table PT (air bearings 42) and base member 41 being relatively moved. In addition, since, in accordance with the configuration of FIGS. 17 and 18, even when there is liquid LQ on upper surface 41A of base member 41, liquid LQ on upper surface 41A of base member 41 can be recovered without stopping the exposure operation on substrate P, disadvantages, e.g., a decrease of the operating rate of exposure apparatus EX can be prevented. Of course, when liquid LQ on base member 41 is detected, it may also be configured such that the exposure operation on substrate P is stopped, and, while relatively moving substrate table PT (air bearings 42) and base member 41, liquid LQ on upper surface 41A of base member 41 is recovered via recovery ports 26. Further, also before or after exposure of substrate P, the liquid recovery operation by use of recovery ports 26 may be performed with respect to a relatively large region on upper surface 41A of base member 41, while substrate table PT (air bearings 42) and base member 41 being relatively moved.

Further, with base member 41's upper surface 41A or side surface 41B being made to be liquid-repellent, the liquid recovery operation can be performed more smoothly without remaining liquid LQ. As the liquid-repellency treatment for making base member 41 to be liquid-repellent, there can be listed a treatment in which a liquid-repellent material, e.g., a fluoroplastic material, e.g., polytetrafluoroethylene (TEFLON®), or an acrylic plastic material is applied. Further, such a liquid-repellent material may be applied to the overall regions on base member 41's upper surface 41A and side surface 41B, or may be selectively applied to a partial region where liquid-repellency is required.

By the way, while, in each of the above-described embodiments, exposure apparatus EX is configured to have one substrate table PT, the present invention can also be applied to an exposure apparatus comprising two tables. This will be described referring to FIG. 19.

Figure 19:
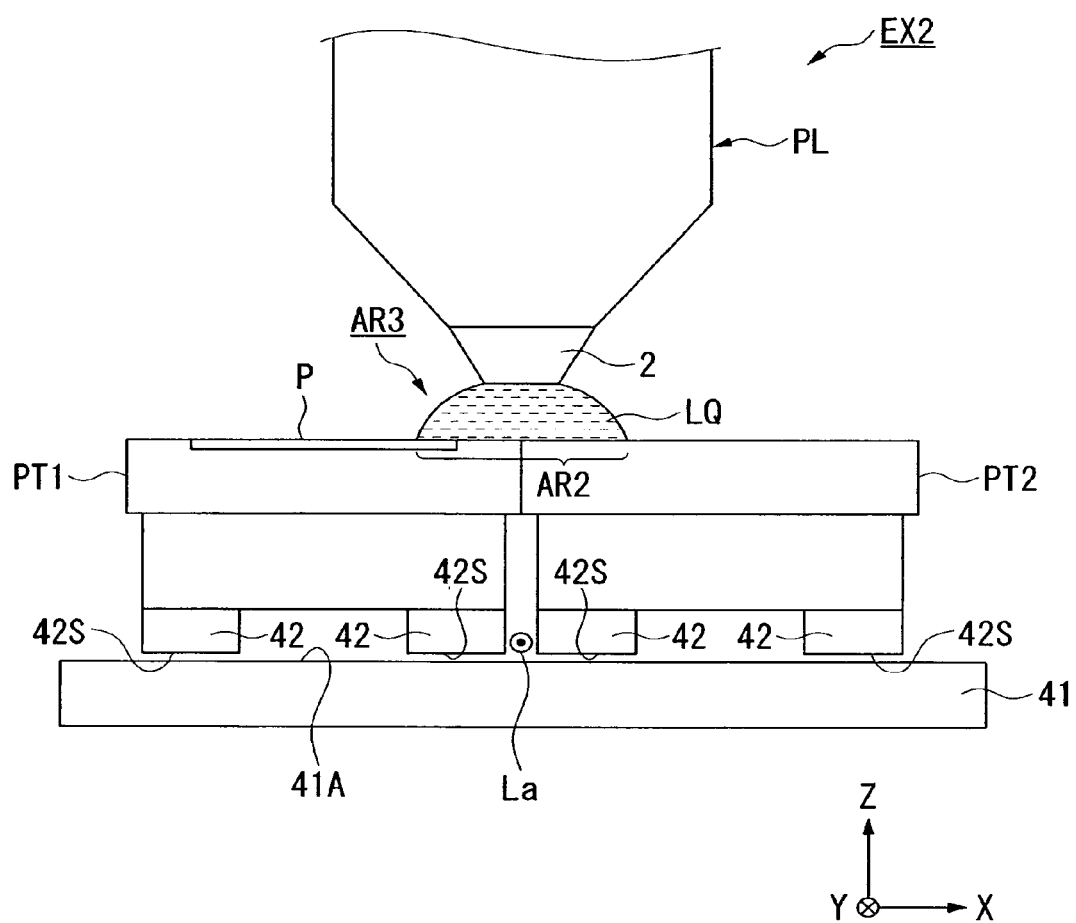
FIG. 19 is a drawing showing an example of an exposure apparatus comprising a first table and a second table.

Exposure apparatus EX2 shown in FIG. 19 comprises substrate table PT1 that is movable in a state of holding substrate P and measurement table PT2 that is provided in a position on a side of substrate table PT1 and is for performing various measurement processes for the purpose of exposure of substrate P. Measurement table PT2 is a table that does not hold substrate P. On measurement table PT2 are provided measurement marks measured by an FIA (Field Image Alignment) type substrate alignment system as disclosed in, e.g., Japanese Unexamined Patent Publication Hei 4-656030 and measurement marks measured by VRA (Visual Reticle Alignment) system as disclosed in, e.g., Japanese Unexamined Patent Publication Hei 7-176468. Also, on measurement table PT2 are provided light sensors, e.g., an illumination uniformity sensor as disclosed in, e.g., Japanese Unexamined Patent Publication Sho 57-117238 and a dose sensor (illumination sensor) as disclosed in Japanese Unexamined Patent Publication Hei 11-16816. Thus, in exposure apparatus EX2 of this embodiment, before exposing substrate P on substrate table PT1, various kinds of correcting processes (lens calibration process etc.) are performed by using the light sensors and measurement marks on measurement table PT2.

Substrate table PT1 and measurement table PT2 are, by means of a stage driving mechanism, movable on base member 41 independently of each other. In addition, the XY-direction positions of substrate table PT1 and measurement table PT2 are measured by interferometers.

In the embodiment shown in FIG. 19, in predetermined region AR3 located directly beneath projection optical system PL is formed liquid immersion region AR2 by liquid immersion mechanism 1 described earlier, and when performing measurement processes, projection optical system PL and measurement table PT2 face each other, and with liquid LQ being filled between projection optical system PL and measurement table PT2, liquid immersion region AR2 is formed. Further, when exposing substrate P on substrate table PT1, projection optical system PL and substrate table PT1 face each other, and with liquid LQ being filled between projection optical system PL and substrate table PT1 (substrate P), liquid immersion region AR2 is formed. In other words, it is configured such that liquid immersion region AR2 is formed on both of substrate table PT1 and measurement table PT2. Further, in this embodiment, it is configured such that liquid LQ's liquid immersion region AR2 moves between substrate table PT1's surface and measurement table PT2's surface. When moving liquid immersion region AR2, controller CONT moves substrate table PT1 and measurement table PT2 together within a region including the above-mentioned projection area AR3 by using the substrate table driving mechanism in a state that substrate table PT1 and measurement table PT2 are, as shown in FIG. 19, close to or in contact with each other and thus moves liquid immersion region AR2 between the upper surface of substrate table PT1 and the upper surface of measurement table PT2. By doing so, without temporarily stopping the liquid supply operation by liquid immersion mechanism 1, liquid immersion region AR2 can be moved between substrate table PT1's surface and measurement table PT2's surface in a condition that liquid LQ is prevented from flowing out through the space (gap) between substrate table PT1 and measurement table PT2.

By the way, while, in the embodiment, with liquid immersion region AR2 being moved between substrate table PT1's surface and measurement table PT2's surface in the state that substrate table PT1 and measurement table PT2 are close to or in contact with each other, liquid LQ is prevented from flowing out, through the gap between substrate table PT1 and measurement table PT2, onto base member 41, there is an undesirable possibility that liquid LQ slightly flows out from the gap. In order to address this undesirable possibility, light projecting portion 61 of detecting device 60 emits, as shown in FIG. 19, detecting light La toward a region, located above base member 41, corresponding to the above-described predetermined region AR3. It is to be noted that light projecting portion 61 in this case is attached to a fixed member, e.g., main column 3. Further, light receiving portion 62 corresponding to the light projecting portion 61 is attached in a predetermined position on, e.g., main column 3 at which light receiving portion 62 faces light projecting portion 61, with base member 41 existing therebetween. By setting, in this manner, the optical path of detecting light La to be located depending on the region in which liquid LQ is apt to flow out, liquid LQ flowing out can be detected promptly and satisfactorily.

Further, in the embodiment of FIG. 19, on each of bearing surface 42S of air bearing 42 provided on substrate table PT1 and bearing surface 42S of air bearing 42 provided on measurement table PT2 are provided detecting devices 65E having been described referring to FIG. 18. With this configuration, when, for example, substrate table PT1 is performing, at the load/unload position, load/unload operations of substrate P, controller CONT can detect whether there is liquid LQ on base member 41 by using detecting devices 65E provided on air bearings 42 of measurement table PT2, while relatively moving measurement table PT2 and base member 41.

By doing so, the operating rate of exposure apparatus EX can be improved.

Further, the present invention can also be applied to a twin-stage type exposure apparatus comprising two stages which is disclosed in, e.g., Japanese Unexamined Patent Publication Hei 10-163099, Japanese Unexamined Patent Publication Hei 10-214783, and Published Japanese Translation 2000-505958. Also in a twin-stage type exposure apparatus, liquid immersion region AR2 can be moved between the two stages in a state that the two stages are made to be close to or in contact with each other.

Further, as described above, the present invention can also be applied to an exposure apparatus comprising a substrate stage and a measurement stage, as disclosed in Japanese Unexamined Patent Publication Hei 11-135400.

Figure 20:
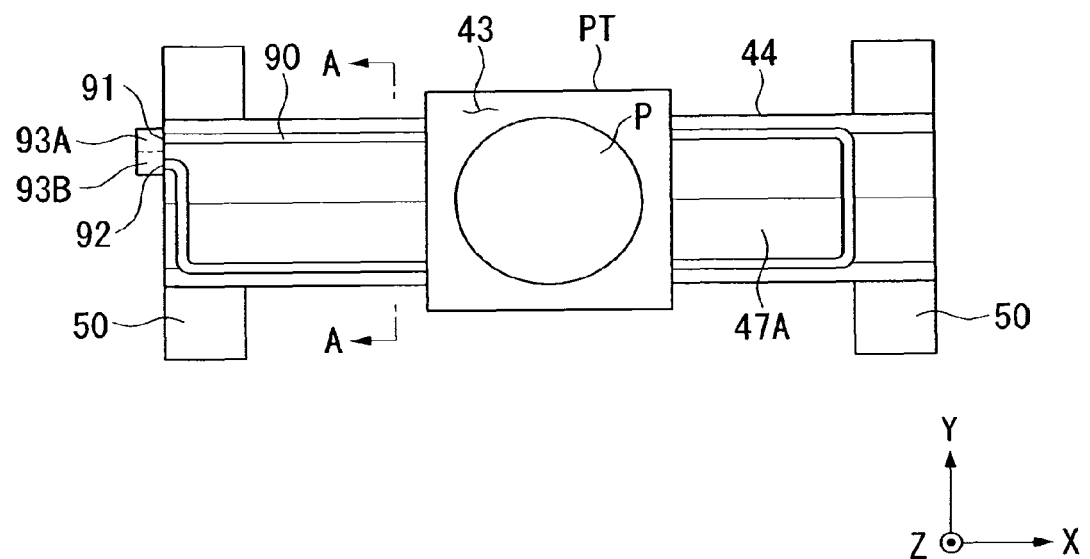
FIG. 20 is a drawing showing another embodiment of the detecting device.
Figure 21:
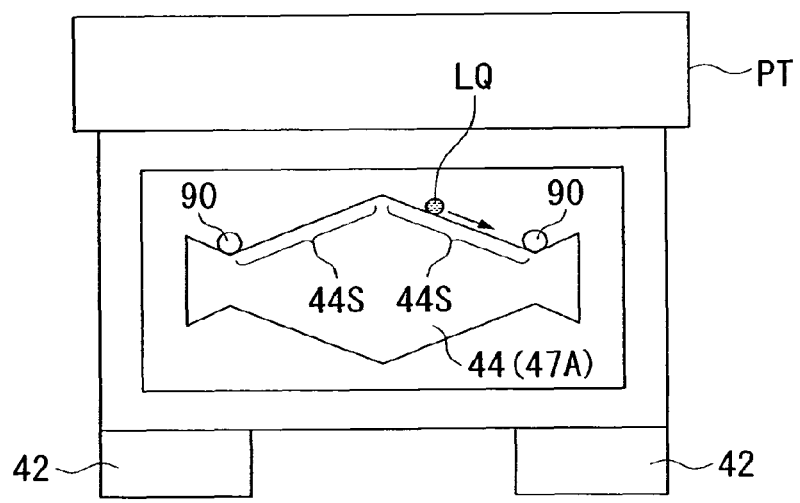
FIG. 21 is a cross-sectional view along the line A-A of FIG. 20.

It is to be noted that while, in each of the above-described embodiments, liquid LQ having flowed out from on substrate table PT is detected by using detecting light La, liquid LQ can also be detected by another system. For example, liquid LQ can also be detected by using an optical fiber. This will be described referring to FIG. 20 and FIG. 21. FIG. 20 is a plan view of substrate table PT as viewed from above; FIG. 21 is a cross-sectional view along the line A-A of FIG. 20.

In FIG. 20, optical fiber 90 for detecting liquid LQ is a so-called cladless optical fiber, and around its core portion through which a light is propagated is not provided any clad portion. Further, the core portion of optical fiber 90 has a refractive index that is larger than that of the gas (in this embodiment, air) surrounding the optical fiber and is smaller than that of the liquid (in this embodiment, purified water). For this reason, when the ambience of optical fiber 90 is filled with air, the light is confined in and propagated by the core portion, which has a refractive index larger than that of air. That is, the light having entered optical fiber 90 through incidence end portion 91 of optical fiber 90 exits from exit end portion 92 without the light amount being attenuated so much. However, when liquid (purified water) LQ has attached to the surface of optical fiber 90, the light leaks outside from the portion of the optical fiber 90 on which the liquid has attached, because total reflection does not occur at the boundary surface between liquid LQ and optical fiber 90. Therefore, the light having entered optical fiber 90 through incidence end portion 91 of optical fiber 90 attenuates its light amount when it exits from exit end portion 92.

In FIG. 20, optical fiber 90 is provided along the peripheral portion of the upper surface of X-guide stage 44. To incidence end portion 91 of optical fiber 90 is connected light projecting portion 93A capable of making a light incident into optical fiber 90, and light projecting portion 93A emits a light having a predetermined light amount toward incidence end portion 91 of optical fiber 90. On the other hand, to exit end portion 92 of optical fiber 90 is connected light receiving portion 93B capable of receiving the light having been propagated by optical fiber 90 and having exited from exit end portion 92.

Based upon the light amount when the light from light projecting portion 93A entered optical fiber 90 and the light amount when the light was received by light receiving portion 93B, controller CONT determines the light's attenuation ratio between optical fiber 90's exit end portion 92 and incidence end portion 91 and, based upon the results, controller CONT judges whether liquid LQ has attached to optical fiber 90, i.e., whether liquid LQ has flowed out from on substrate table PT onto X-guide stage 44. Next, when controller CONT has judged that liquid LQ has flowed out, controller CONT takes an appropriate step, e.g., a step to stop the liquid supply operation by liquid supply mechanism 10.

Here, X-guide stage 44 comprises stator 47A of X-linear motor 47, and stator 47A has, e.g., a coil unit and a housing portion that surrounds the coil unit. Further, as shown in FIG. 21, the surface of X-guide stage 44 (in this instance, the surface of the housing portion of stator 47A) has slanting regions 44S that are inclined such that they lower from the center portion toward the peripheral portions. Optical fiber 90 is located in the lowest positions of slanting regions 44S. Thus, liquid LQ having flowed out from on substrate table PT onto X-guide stage 44 moves to the slanting regions 44S' lowest positions by the action of gravitation. Therefore, optical fiber 90 located in the slanting regions 44S' lowest positions can assuredly detect liquid LQ having flowed out.

Figure 22:
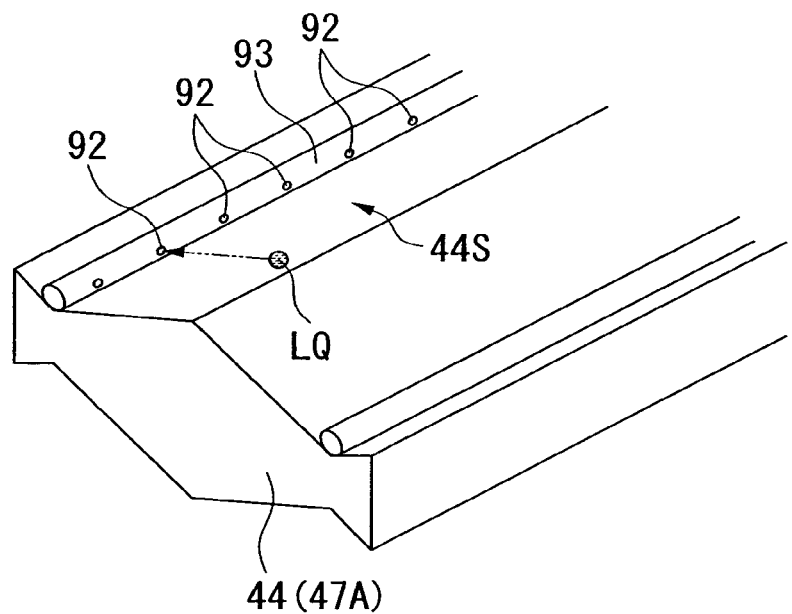
FIG. 22 is a perspective view showing another embodiment of the liquid recovery mechanism.

Further, as shown in FIG. 22, instead of or in addition to the above-described optical fiber 90, recovery pipe 93 having recovery holes 92 may be provided in the slanting regions 44S' lowest positions. A plurality of recovery holes 92 are provided on the wall portion of recovery pipe 93 at predetermined intervals. The inside of recovery pipe 93 is kept to have a negative pressure, and liquid LQ having flowed out onto X-guide stage 44 flows into recovery pipe 93 via recovery holes 92 and is recovered.

Figure 23:
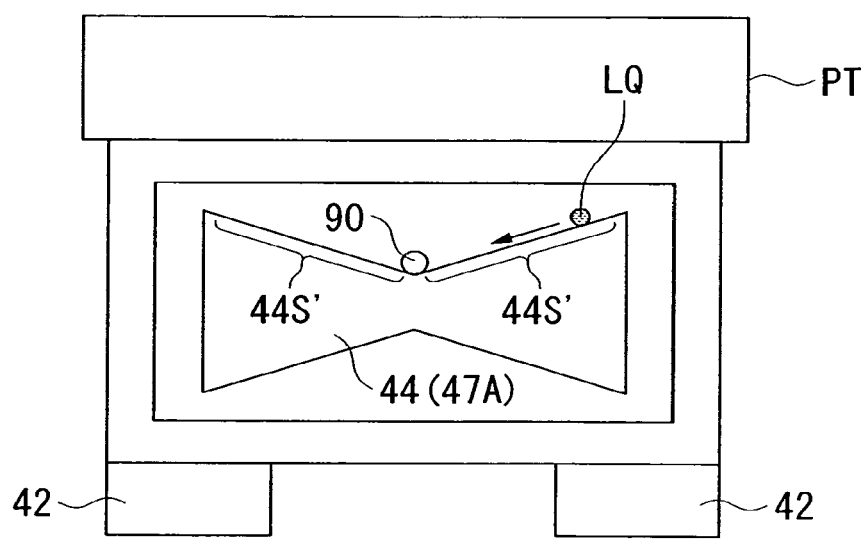
FIG. 23 is a drawing showing another embodiment of the detecting device

Further, as shown in FIG. 23, the surface of X-guide stage 44 (in this instance, the surface of the housing portion of stator 47A) may also be configured to have slanting regions 44S' that are inclined such that they lower from the peripheral portions toward the center portion. Optical fiber 90 is located in the lowest position of slanting regions 44S'. Thus, liquid LQ having flowed out from on substrate table PT onto X-guide stage 44 moves to the slanting regions 44S' lowest position by the action of gravitation. Therefore, optical fiber 90 located in the slanting regions 44S' lowest position can assuredly detect liquid LQ having flowed out. Further, also in the embodiment of FIG. 23, instead of or in addition to the above-described optical fiber 90, such a recovery pipe 93 having recovery holes 92 as shown in FIG. 22 may be provided in the slanting regions 44S' lowest position. It is to be noted that as the detection system of liquid LQ, a detection system using an image pickup device may also be adopted. It may be configured such that by disposing an image pickup device on, e.g., guided member 50 and by applying an image processing on results from the image pickup device or displaying on a monitor results from the image pickup device, liquid LQ remaining on upper surface 41a of base member 41 is detected.

As described above, in the embodiments, liquid LQ is constituted by purified water. Purified water has the advantage that it is easily available in bulk in, e.g., semiconductor manufacturing factories and also the advantage that it does not adversely affect photoresist on substrate P, optical elements (lenses), etc. Further, purified water does not adversely affect the environment and contains scarcely any impurities; thus, the effect that it cleans the surface of substrate P and the surface of the optical element provided at the end portion of projection optical system PL can be expected. It should be noted that when the purity of the purified water supplied from, e.g., the factory, it may be configured such that the exposure apparatus itself has an ultrapure water system.

The refractive index n of purified water (water) relative to exposure light EL having a wavelength of about 193 nm is said to be approximately 1.44, and when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Further, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

It is to be noted that when the liquid immersion method is used as described above, the numerical aperture NA of the projection optical system may become between 0.9 and 1.3. When, in this manner, the numerical aperture NA of the projection optical system becomes large, a random-polarized light conventionally used as the exposure light may, because of its polarization effect, adversely affect the imaging performance; thus, a polarized light illumination method is preferably used. In that case, it is preferable that by performing linearly polarized light illumination in which the longitudinal direction of the line pattern of the line-and-space patterns on the mask (reticle) is aligned with the polarization direction, a lot of diffraction lights from S polarization components (TE polarization components), i.e., the diffraction lights from the polarization components having the polarization direction in line with the longitudinal direction of the line pattern are emitted from the pattern of the mask (reticle). When the space between projection optical system PL and the resist applied to the surface of substrate P is filled with the liquid, the transmittance at the resist surface of the diffraction lights from S polarization components (TE polarization components), which contribute to the improvement of the contrast, is higher compared with the case where the space between projection optical system PL and the resist applied to the surface of substrate P is filled with the gas (air), a high imaging performance can be obtained even in the case where the numerical aperture NA of the projection optical system is over 1.0. Further, a phase shift mask, an oblique incidence illumination method (in particular, a dipole illumination method), as disclosed in Japanese Unexamined Patent Publication Hei 6-188169, which aligns with the longitudinal direction of the line pattern, etc. may be appropriately combined with the above configuration, which works more effectively. In particular, a combination of a linearly polarized light illumination method and a dipole illumination method works effectively when the periodic direction of line-and-space patterns is limited to a predetermined single direction or when hole patterns are densely located along a predetermined direction. For example, assuming that, when a half-tone type phase shift mask having a transmittance of 6% (pattern having a half-pitch of about 45 nm) is illuminated by using a combination of a linearly polarized light illumination method and a dipole illumination method, illumination a defined by the circumscribing circle of the two light beams forming the dipole in the pupil plane is 0.95, that the radius of each of the light beams in the pupil plane is 0.125 σ, and that the numerical aperture NA of projection optical system PL is 1.2, the depth of focus (DOF) can be increased by about 150 nm compared with that when a random-polarized light is used.

Further, a combination of a linearly polarized light illumination method and a small σ illumination method (in which the σ value defined by the ratio of the illumination system's numerical aperture NAi and the projection optical system's numerical aperture Nap becomes 0.4 or less) also effectively works.

It should be noted that, for example, when by using, for example, ArF excimer laser light as the exposure light and using projection optical system PL having a reduction magnification of about ¼, a fine line-and-space pattern (e.g., line-and-space of about between 25 and 50 nm) is exposed onto substrate P, depending on the structure of mask M (e.g., the fineness of the pattern or the thickness of chrome), mask M acts as a polarization plate due to the Wave Guide effect, and the emitted amount of the diffraction lights from S polarization components (TE polarization components) becomes larger than the emitted amount of the diffraction lights from P polarization components (TM polarization components), which lower the contrast. In this case, the above-described linearly polarized light illumination is preferably employed, but even when mask M is illuminated with a random-polarized light, a high resolution performance can be obtained even in the case where the numerical aperture NA of the projection optical system PL is 0.9 to 1.3.

Further, although, for example, when a very fine line-and-space pattern on mask M is exposed onto substrate P, there is the possibility that the emitted amount of the diffraction lights from P polarization components (TM polarization components) becomes larger than the emitted amount of the diffraction lights from S polarization components (TE polarization components) due to the Wire Grid effect, since, for example, when by using, for example, an ArF excimer laser light as the exposure light and using projection optical system PL having a reduction magnification of about ¼, a line-and-space pattern of more than 25 nm is exposed onto substrate P, the emitted amount of the diffraction lights from S polarization components (TE polarization components) is larger than the emitted amount of the diffraction lights from P polarization components (TM polarization components), a high resolution performance can be obtained even in the case where the numerical aperture NA of the projection optical system is as large as 0.9 to 1.3.

Further, not only the linearly polarized light illumination, in which the longitudinal direction of the line pattern on the mask (reticle) is aligned with the polarization direction, but also the combination, as disclosed in Japanese Unexamined Patent Publication Hei 6-53120, of a polarized light illumination method in which the lights used are linearly polarized in the tangential directions relative to a circle of which center is the optical axis and an oblique incidence illumination method is effective. In particular, in a case where the pattern of the mask (reticle) includes not only line patterns which extend in a predetermined single direction but also line patterns which extends in multiple different directions (a case where line-and-space patterns having different periodic directions exist mixedly), by using, as also disclosed in Japanese Unexamined Patent Publication Hei 6-53120, a polarized light illumination method in which the lights used are linearly polarized in the tangential directions relative to a circle of which center is the optical axis in combination with an annular illumination method, a high resolution performance can be obtained even in the case where the numerical aperture NA of the projection optical system is large. For example, assuming that, when a half-tone type phase shift mask having a transmittance of 6% (pattern having a half-pitch of about 63 nm) is illuminated by using a combination of a polarized light illumination method in which the lights used are linearly polarized in the tangential directions relative to a circle of which center is the optical axis and an annular illumination method (having an annular ratio of between 3 and 4), the illumination σ is 0.95 and that the numerical aperture NA of projection optical system PL is 1.00, the depth of focus (DOF) can be increased by about 250 nm compared with that when a random-polarized light is used, and, when assuming that a pattern having a half-pitch of about 55 nm is illuminated and the numerical aperture NA of projection optical system PL is 1.2, the depth of focus can be increased by about 100 nm.

Further, in addition to the above-described various kinds of illumination methods, it is also effective to apply a progressive focus exposure method, as disclosed in, e.g., Japanese Unexamined Patent Publication Hei 4-277612 or Japanese Patent Application Publication No. 2001-345245, or a multi-wavelength exposure method in which by using an exposure light of multiple wavelengths (e.g., two wavelengths), an effect equivalent to that of the progressive focus exposure method is obtained.

In the embodiments, optical element 2 is attached to the end of projection optical system PL, and by this lens, the optical characteristics of projection optical system PL (spherical aberration, coma aberration, etc.) can be adjusted. It should be noted that as the optical element to be attached to the end of projection optical system PL, an optical plate used for the adjustment of the optical characteristics of projection optical system PL may be utilized. Alternatively, a plane parallel plate that can transmit exposure light EL may be utilized. Further, while the exposure apparatus, to which the above-described immersion liquid method is applied, is configured such that with the optical path space on the exit side of optical element 2 of projection optical system PL being filled with a liquid (purified water), substrate P is exposed, the optical path space on the incidence side of optical element 2 of projection optical system PL may also be filled with the liquid (purified water), as disclosed in the International Publication WO 2004/019128.

It should be noted that if the pressure, caused by the flow of liquid LQ, of the space between the optical element located at the end of projection optical system PL and substrate P is high, it may be configured such that the optical element is rigidly fixed so as not to move due to the pressure, instead of making the optical element replaceable.

It should be noted that while, in the embodiments, it is configured such that the space between projection optical system PL and the surface of substrate P is filled with liquid LQ, it may also be configured, for example, such that the space is filled with liquid LQ in the condition that a cover glass constituted by a plane parallel plate is attached to the surface of substrate P.

It should be noted that while, in the embodiments, liquid LQ is water (purified water), liquid LQ may be a liquid Other than water. For example, when the light source of exposure light EL is an $F_2$ laser, the $F_2$ laser light does not transmit through water, and thus, as liquid LQ, a fluorofluid that can transmit the $F_2$ laser light, such as perfluoropolyether (PFPE) or fluorochemical oil, may be used. In this case, the portions that come into contact with liquid LQ are applied with lyophilic treatment, by forming a thin film of a substance which includes, e.g., fluorine and has a molecular structure of a small polarity. Further, as liquid LQ, a material (e.g., cedar oil) that can transmit exposure light EL, has a high refractive index as high as practicable, and does not affect projection optical system PL and the photoresist applied to the surface of substrate P can also be used. Also in this case, the surface treatment is applied in accordance with the polarity of liquid LQ to be used.

It is to noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Regarding exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used.

Further, regarding exposure apparatus EX, the present invention can be applied to an exposure apparatus in which in the state that a first pattern and substrate P are substantially stationary, the reduction image of the first pattern is exposed at one time by using a projection optical system (e.g., a refraction type projection optical system that has a reduction magnification of ⅛ and includes no reflecting element). In this case, the present invention can be applied to a stitch type one-shot exposure apparatus in which thereafter, in the state that a second pattern and substrate P are substantially stationary, the reduction image of the second pattern is exposed at one time onto substrate P by using the projection optical system in a manner that the first pattern image and the second pattern image partially overlap with each other. Further, in conjunction with the stitch type exposure apparatus, the present invention can also be applied to a step-and-stitch type exposure apparatus in which at least two patterns are transferred onto substrate P in a partially overlapping manner, and substrate P is successively moved.

In the above-described embodiments, a light transmission type mask on which a predetermined light-shielding pattern (or a phase pattern/light decreasing pattern) is formed on a light transmissive substrate is used, but, instead of such mask, an electronic mask that forms, based upon the electronic data of a pattern to be exposed, a transmission pattern, a reflection pattern, or a light emitting pattern may also be used, as disclosed in, e.g., U.S. Pat. No. 6,778,257.

Further, the present invention can be applied also to an exposure apparatus (lithography system) in which by forming interference fringes on wafer W, a line-and-space pattern is exposed onto substrate P, as disclosed in the International Publication WO 2001/035168.

Further, while, in the above-described embodiments, the exposure apparatus, in which the liquid locally fills the space between projection optical system PL and substrate P, is adopted, the present invention can also be applied to a liquid immersion exposure apparatus in which the entire surface of a substrate to be exposed is covered by a liquid. The structure and exposure operation of an exposure apparatus in which the entire surface of a substrate to be exposed is covered by a liquid are described in, e.g., Japanese Unexamined Patent Publication Hei 6-124873, Japanese Unexamined Patent Publication Hei 10-303114, or U.S. Pat. No. 5,825,043.

Regarding the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices (CCDs), and an exposure apparatus for manufacturing reticles or masks.

When using a linear motor (see U.S. Pat. No. 5,623,853 or U.S. Pat. No. 5,528,118) in substrate stage PST or mask stage MST, either air-cushion type linear motor using an air bearing or a magnetic levitation type linear motor using a Lorentz force or reactance force may be used. Further, substrate stage PST may be either of a type moving along a guide or of a guideless type having no guide. Further, each of stages PST and MST may be either of a type moving along a guide or of a guideless type having no guide.

As the driving mechanism for each of stages PST and MST, a planar motor in which by making a magnet unit in which magnets are two-dimensionally arranged and an armature unit in which coils are two-dimensionally arranged face each other, each of PST and MST is driven by an electromagnetic force may be used. In this case, either one of the magnet unit and the armature unit is attached to stage PST or stage MST, and the other unit is attached to the moving surface side of stage PST or stage MST.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and pneumatic pressure piping connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, cleanliness, etc. are controlled.

Figure 24:
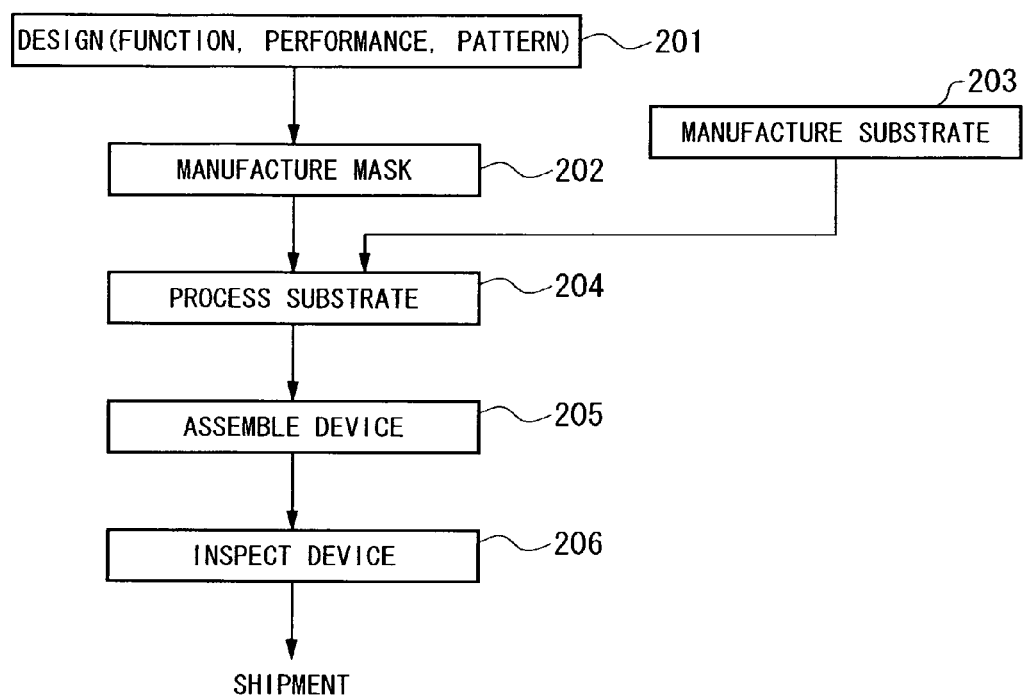
FIG. 24 is a flowchart showing an example of a semiconductor-device manufacturing process.

As shown in FIG. 24, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; substrate processing step 204 including a process in which the mask pattern is exposed onto the substrate by exposure apparatus EX according to the above-described embodiments; device assembly step 205 (including a dicing process, a bonding process, and a packaging process); inspection step 206.

The invention claimed is:

1. An exposure apparatus that exposes a substrate via a projection optical system and a liquid, comprising:
   a movable member that is configured to move relative to a predetermined member; and
   a detection device that is supported by the movable member and is configured to detect whether there is any of the liquid on and in contact with a predetermined surface of the predetermined member, which is other than the movable member, the exposure apparatus being configured such that the substrate is moved relative to and above the predetermined surface of the predetermined member during exposure of the substrate.

2. The exposure apparatus according to claim 1, wherein the detecting device is configured to optically detect the presence of the liquid.

3. The exposure apparatus according to claim 2, wherein the detecting device is configured to detect the presence of the liquid while the movable member moves and while emitting a detecting light.

4. The exposure apparatus according to claim 1, wherein the predetermined member supports a driving mechanism configured to move a table that is movable while holding the substrate.

5. The exposure apparatus according to claim 1, wherein the predetermined member comprises a base member having a guide surface that guides movement of a table, which is movable while holding the substrate.

6. The exposure apparatus according to claim 1, wherein the exposure apparatus comprises a first movable member and a second movable member,
   wherein the detecting device has a light projecting portion that emits a detecting light and a light receiving portion that is disposed at a predetermined position with respect to the detecting light and detects the detecting light;
   wherein the first movable member supports the light projecting portion and the second movable member supports the light receiving portion;
   and wherein the presence of the liquid is detected while the first movable member and the second movable member move synchronously.

7. The exposure apparatus according to claim 1, wherein the detecting device emits a detecting light toward the predetermined member, receives the detecting light from the predetermined member, and detects, based upon the light receiving result, the presence of the liquid on the predetermined member.

8. The exposure apparatus according to claim 1, wherein the exposure apparatus comprises a first table and a second table that are movable in a two dimensional plane independently of each other, wherein the detecting device is provided on at least one of the first table and the second table.

9. The exposure apparatus according to claim 1, wherein the movable member comprises a table configured to support the substrate.

10. The exposure apparatus according to claim 1, wherein the movable member is configured to hold the substrate and to move the substrate during exposure of the substrate.

11. A liquid detection method used in an exposure apparatus that exposes a substrate via a projection optical system and a liquid, the method comprising:
   moving a movable member relative to a predetermined member, a detecting device being supported by the movable member;
   detecting, with the detecting device, whether there is any of the liquid on and in contact with a predetermined surface of the predetermined member, which is other than the movable member; and
   exposing the substrate while the substrate is moved relative to and above the predetermined surface of the predetermined member.

12. The method according to claim 11, wherein the detecting device is configured to optically detect the presence of the liquid.

13. The method according to claim 12, wherein the detecting device is configured to detect the presence of the liquid while the movable member moves and while emitting a detecting light.

14. The method according to claim 11, wherein the predetermined member supports a driving mechanism configured to move a table that is movable while holding the substrate.

15. The method according to claim 11, wherein the predetermined member comprises a base member having a guide surface that guides a movement of a table, which is movable while holding the substrate.

16. The method according to claim 11,
   wherein the exposure apparatus comprises a first movable member and a second movable member,
   wherein the detecting device has a light projecting portion that emits a detecting light and a light receiving portion that is disposed at a predetermined position with respect to the detecting light and detects the detecting light;
   wherein the first movable member supports the light projecting portion and the second movable member supports the light receiving portion;
   and wherein the presence of the liquid is detected while the first movable member and the second movable member move synchronously.

17. The method according to claim 11, wherein the detecting device emits a detecting light toward the predetermined member, receives the detecting light from the predetermined member, and detects, based upon the light receiving result, the presence of the liquid on the predetermined member.

18. The method according to claim 11,
   wherein the exposure apparatus comprises a first table and a second table that are movable in a two dimensional plane independently of each other,
   and wherein the detecting device is provided on at least one of the first table and the second table.

19. The method according to claim 11, wherein the movable member comprises a table configured to support the substrate.

20. The method according to claim 11, wherein the movable member is configured to hold the substrate and to move the substrate during exposure of the substrate.

* * * * *